(12) United States Patent
Nohtomi et al.

(10) Patent No.: US 10,928,944 B1
(45) Date of Patent: Feb. 23, 2021

(54) DEVICE AND METHOD FOR PROXIMITY SENSING ON AN INPUT DEVICE

(71) Applicant: SYNAPTICS INCORPORATED, San Jose, CA (US)

(72) Inventors: Shinobu Nohtomi, Tokyo (JP); Nobukazu Tanaka, Tokyo (JP); Takayuki Noto, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/692,755

(22) Filed: Nov. 22, 2019

(51) Int. Cl.
| | |
|---|---|
| G06F 3/041 | (2006.01) |
| H03K 17/955 | (2006.01) |
| G06F 3/044 | (2006.01) |
| G09G 3/20 | (2006.01) |
| G09G 3/3225 | (2016.01) |
| G09G 3/36 | (2006.01) |

(52) U.S. Cl.
CPC ............ *G06F 3/0412* (2013.01); *G06F 3/044* (2013.01); *G06F 3/0416* (2013.01); *G09G 3/2007* (2013.01); *H03K 17/955* (2013.01); *G06F 2203/04108* (2013.01); *G09G 3/3225* (2013.01); *G09G 3/3648* (2013.01); *G09G 2310/0243* (2013.01); *G09G 2354/00* (2013.01)

(58) Field of Classification Search
CPC .......... G09G 2310/0243; G09G 3/2007; G06F 3/0416; G06F 3/04155; G06F 2230/04108; G06F 3/0412
See application file for complete search history.

(56) References Cited

U.S. PATENT DOCUMENTS

2017/0168624 A1* 6/2017 Lee ........................ G06F 3/0416

* cited by examiner

*Primary Examiner* — Laurence J Lee
(74) *Attorney, Agent, or Firm* — Leydig, Voit & Mayer, Ltd.

(57) ABSTRACT

A processing system comprises a first source amplifier and an analog front end. The first source amplifier comprises a first input electrically connectable to a first sensor electrode of a display panel and configured to generate a first drive signal based on a first grayscale voltage corresponding to a first pixel data and generate a first comparison output signal based on a first sensing signal from the first sensor electrode and a reference voltage. The analog front end is configured to generate a first digital detection data used for proximity sensing based on the first comparison output signal outputted from the first source amplifier.

22 Claims, 14 Drawing Sheets

F I G . 1
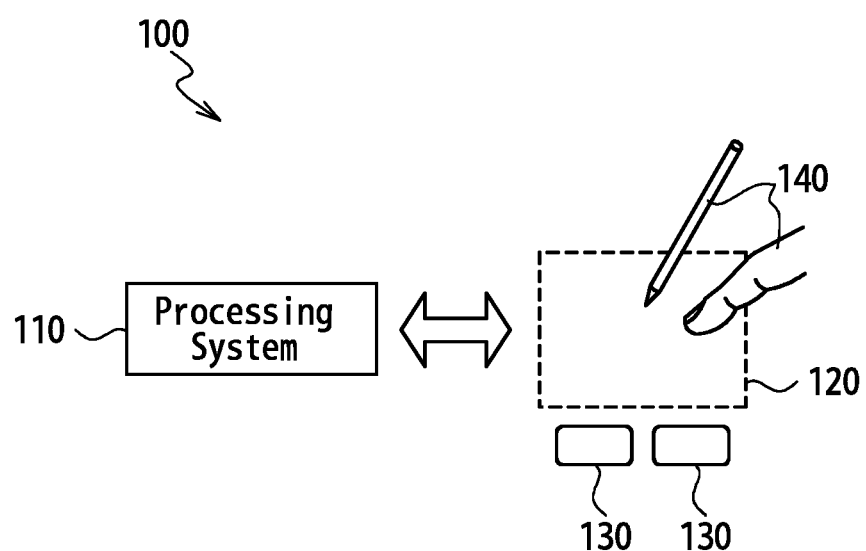

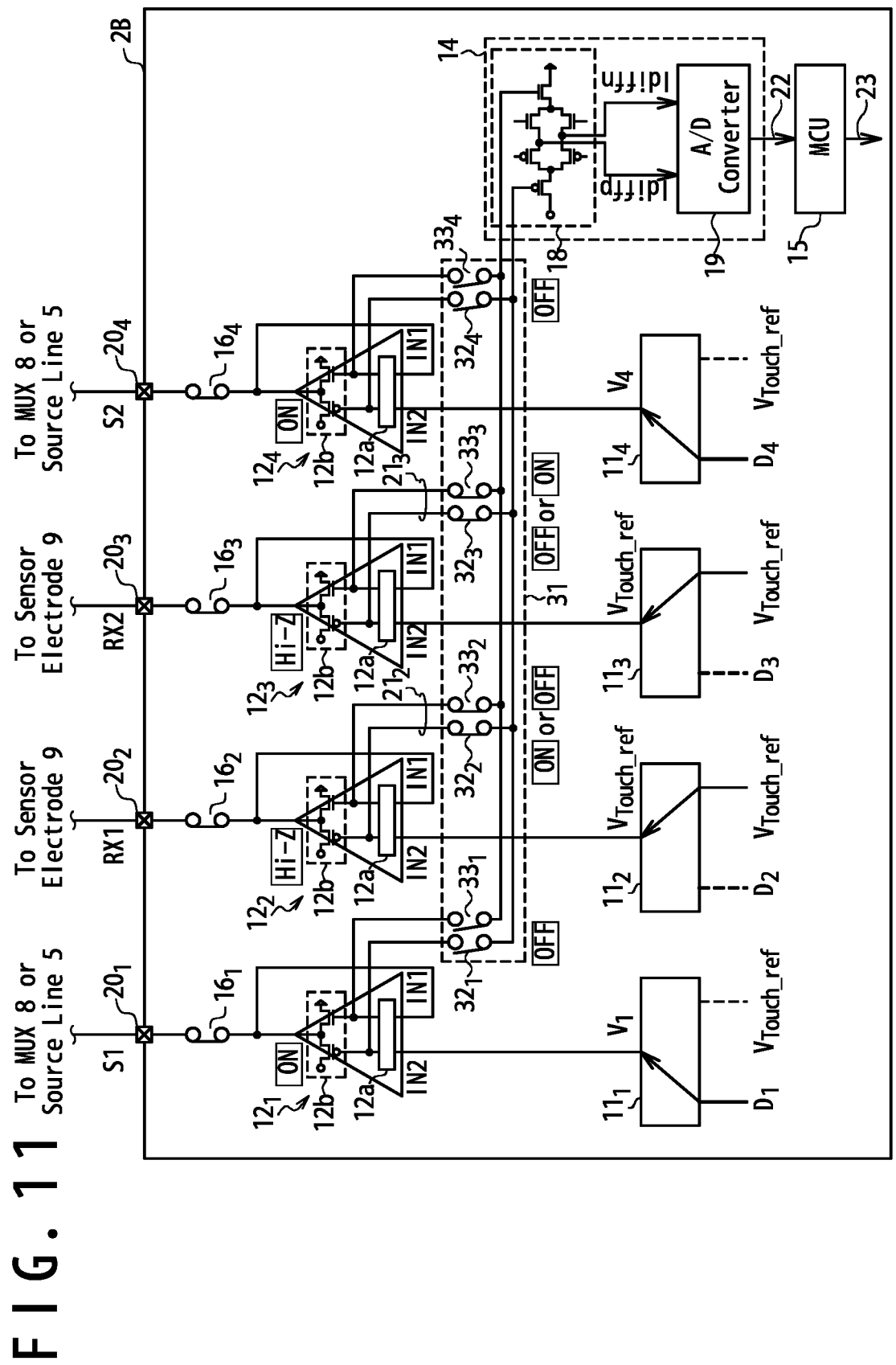
F I G. 11

DEVICE AND METHOD FOR PROXIMITY SENSING ON AN INPUT DEVICE

BACKGROUND

Field

Embodiments disclosed herein generally relate to a device and method for proximity sensing on an input device.

Description of the Related Art

Input devices including proximity sensor devices may be used in a variety of electronic systems. A proximity sensor device may include a sensing region, demarked by a surface, in which the proximity sensor device determines the presence, location, force and/or motion of one or more input objects. Proximity sensor devices may be used to provide interfaces for the electronic system. For example, proximity sensor devices may be used as input devices for larger computing systems, such as touchpads integrated in, or peripheral to, notebook or desktop computers. Proximity sensor devices may also often be used in smaller computing systems, such as touch screens integrated in cellular phones.

SUMMARY

In one or more embodiments, a processing system comprises a first source amplifier and an analog front end. The first source amplifier comprises a first input electrically connectable to a first sensor electrode of a display panel. The first source amplifier is configured to generate a first drive signal based on a first grayscale voltage corresponding to a first pixel data and generate a first comparison output signal based on a first sensing signal from the first sensor electrode and a reference voltage. The analog front end is configured to generate first digital detection data for proximity sensing based on the first comparison output signal.

In one or more embodiments, an input device comprises a display panel and a processing system. The display panel comprises a first sensor electrode. The processing system comprises a first source amplifier and an analog front end. The first source amplifier comprises a first input electrically connectable to the first sensor electrode. The first source amplifier is configured to generate a first drive signal based on a first grayscale voltage corresponding to a first pixel data and generate a first comparison output signal based on a first sensing signal from the first sensor electrode and a reference voltage. The analog front end is configured to generate a first digital detection data for proximity sensing based on the first comparison output signal.

In one or more embodiments, a method comprises connecting a sensor electrode of a display panel to a first input of a first source amplifier configured to generate a first drive signal for a display element of a display panel based on a first grayscale voltage corresponding to a first pixel data. The method further comprises generating a first comparison output signal based on a sensing signal from the sensor electrode and a reference voltage by the first source amplifier and performing proximity sensing on the display panel based on the first comparison output signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 1 is a schematic block diagram of an input device, according to one or more embodiments.

FIG. 11 illustrates an example operation of a processing system, according to one or more embodiments.

Figure 2:
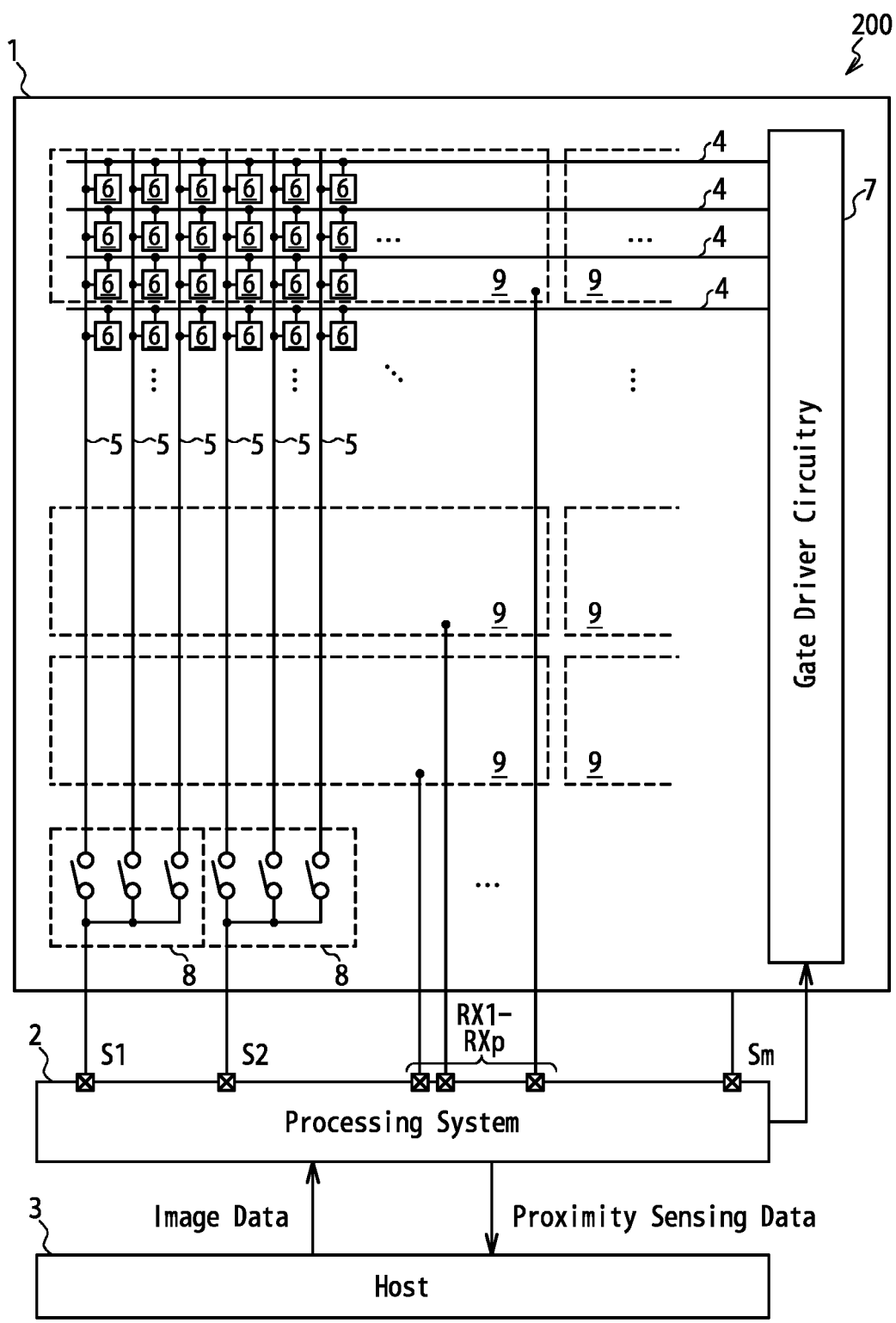
FIG. 2 illustrates an example configuration of an input device, according to one or more embodiments.

To facilitate understanding, identical reference numerals have been used, where possible, to designate identical elements that are common to the figures. Note that suffixes may be attached to reference numerals to distinguish the same components from each other. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

An example input device 100 as shown in FIG. 1 in accordance with embodiments of the disclosure may be configured to provide input to an electronic system (not shown). As used in this document, the term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices, e.g., remote controllers and mice, and data output devices, e.g., display screens and printers. Other examples include remote terminals, kiosks, and video game machines, e.g., video game consoles, portable gaming devices, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device.

The input device 100 can be implemented as a physical part of the electronic system, or can be physically separate from the electronic system. In one embodiment, the electronic system may be referred to as a host device. As appropriate, the input device 100 may communicate with parts of the electronic system using any one or more of the following: buses, networks, and other wired or wireless interconnections. Examples include I2C, SPI, PS/2, Universal Serial Bus (USB), Bluetooth, RF, and IRDA.

In FIG. 1, the input device 100 is shown as a proximity sensor device configured to sense input provided by one or more input objects 140 in a sensing region 120. Example input objects 140 include fingers and styli, as shown in FIG. 1. An exemplary proximity sensor device may be a touchpad, a touch screen, a touch sensor device and the like.

Sensing region 120 encompasses any space above, around, in and/or near the input device 100 in which the input device 100 is able to detect user input, e.g., user input provided by one or more input objects 140. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiment's sense input that comprises: no contact with any surfaces of the input device 100; contact with an input surface, e.g., a touch surface, of the input device 100: contact with an input surface of the input device 100 coupled with some amount of applied force or pressure; and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images (e.g., of capacitive signals) that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (also often referred to as "absolute capacitance") sensing methods based on changes in the capacitive coupling between sensor electrodes and an input object (e.g., between a system ground and freespace coupling to the user). In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g., system ground, and by detecting the capacitive coupling between the sensor electrodes and input objects. In some implementations sensing elements may be formed of a substantially transparent metal mesh (e.g., a reflective or absorbing metallic film patterned to minimize visible transmission loss from the display subpixels). Further, the sensor electrodes may be disposed over a display of a display device. The sensing electrodes may be formed on a common substrate of a display device (e.g., on the encapsulation layer of a rigid or flexible organic light emitting diode (OLED) display). An additional dielectric layer with vias for a jumper layer may also be formed of a substantially transparent metal mesh material (e.g., between the user input and the cathode electrode). Alternately, the sensor may be patterned on a single layer of metal mesh over the display active area with cross-overs outside of the active area. The jumpers of the jumper layer may be coupled to the electrodes of a first group and cross over sensor electrodes of a second group. In one or more embodiments, the first and second groups may be orthogonal axes to each other. Further, in various embodiments, the absolute capacitance measurement may comprise a profile of the input object couplings accumulated along one axis and projected onto the other. In various embodiments, a modulated an input object (e.g., a powered active stylus) may be received by the orthogonal electrode axes without modulation of the corresponding electrodes (e.g., relative to a system ground). In such an embodiment, both axes may be sensed simultaneously and combined to estimate stylus position.

Some capacitive implementations utilize "mutual capacitance" (also often referred to as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also referred to herein as "transmitter electrodes" or "transmitters") and one or more receiver sensor electrodes (also referred to herein as "receiver electrodes" or "receivers"). The coupling may be reduced when an input object coupled to a system ground approaches the sensor electrodes. Transmitter sensor electrodes may be modulated relative to a reference voltage, e.g., system ground, to transmit transmitter signals. Receiver sensor electrodes may be held substantially constant relative to the reference voltage or modulated relative to the transmitter sensor electrodes to facilitate receipt of resulting signals. A resulting signal may comprise effect(s) corresponding to one or more transmitter signals, and/or to one or more sources of environmental interference, e.g., other electromagnetic signals. Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) chips and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (in another embodiment, with associated firmware) separate from the central processing unit. As another example, the input device 100 may be physically integrated in a phone, and the processing system 110 may comprise circuits and firmware that are part of a main processor (e.g., a mobile device application processor or any other central processing unit) of the phone. In some embodiments, the processing system 110 is dedicated to implementing the input device 100. In other embodiments, the processing system 110 also performs other user input functions, such as operating display screens, measuring input forces, measuring tactile switch state, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system, e.g., to a central processing system of the electronic system that is separate from the processing system 110, if such a separate central processing system exists. In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. The filtering may comprise one or more of demodulating, sampling, weighting, and accumulating of analog or digitally converted signals (e.g., for FIR digital or IIR switched capacitor filtering) at appropriate sensing times. The sensing times may be relative to the display output periods (e.g., display line update periods or blanking periods). As yet another example, the processing system 110 may subtract or otherwise account for a baseline, such that the information reflects a difference between the electrical signals from user input and the baseline signals. A baseline may account for display update signals (e.g., subpixel data signal, gate select and deselect signal, or emission control signal) which are spatially filtered (e.g., demodulated and accumulated) and removed from the lower spatial frequency sensing baseline. Further, a baseline may compensate for a capacitive coupling between the sensor electrodes and one or more nearby electrodes. The nearby electrodes may be display electrodes, unused sensor electrodes, and or any proximate conductive object. Additionally, the baseline may be compensated for using digital or analog means. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of a display screen. For example, the sensing region 120 may overlap at least a portion of an active area of a display screen (or display panel). The active area of the display panel may correspond to a portion of the display panel where images are updated. In one or more embodiments, the input device 100 may comprise substantially transparent sensor electrodes (e.g., ITO, metal mesh, etc.) overlaying the display screen and provide a touch screen interface for the associated electronic system. The display panel may be any type of dynamic display capable of displaying a visual interface to a user, and may include any type of light emitting diode (LED), OLED, cathode ray tube (CRT), liquid crystal display (LCD), plasma, electroluminescence (EL), or other display technology. The input device 100 and the display panel may share physical elements. For example, some embodiments may utilize some of the same electrical components for displaying and sensing. As another example, the display panel may be operated in part or in total by the processing system 110.

A cathode electrode of an OLED display may provide a low impedance screen between one or more display electrodes and the sensor electrodes which may be separated by a thin encapsulation layer. For example, the encapsulation layer may be about 10 um. Alternatively, the encapsulation layer may be less than 10 um or greater than 10 um. Further, the encapsulation layer may be comprised of a pin hole free stack of conformal organic and inorganic dielectric layers.

It should be understood that while many embodiments of the disclosure are described in the context of a fully functioning apparatus, the mechanisms of the present disclosure are capable of being distributed as a program product, e.g., software, in a variety of forms. For example, the mechanisms of the present disclosure may be implemented and distributed as a software program on information bearing media that are readable by electronic processors, e.g., non-transitory computer-readable and/or recordable/writable information bearing media readable by the processing system 110. Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

In one or more embodiments, as illustrated in FIG. 2, an input device 200 comprises a display panel 1, such as a liquid crystal display (LCD) panel or an organic light emitting diode (OLED) panel, and a processing system 2. In various embodiments, the processing system 2 is configured to supply drive signals to the display panel 1 based on image data received from a host 3 to display an image corresponding to the image data on the display panel 1. In some embodiments, the input device 200 is additionally configured to perform proximity sensing to detect a contact or an approach of an input object, such as the input object 140, to the display panel 1. The processing system 2 may be configured to send proximity sensing data to the host 3. The proximity sensing data may be indicative of the result of proximity sensing.

In one or more embodiments, the display panel 1 comprises gate lines 4 (which may be also referred to as scan lines), source lines 5 (which may be also referred to as data lines), display elements 6, and gate driver circuitry 7.

In one or more embodiments, each display element 6 is disposed at an intersection of a corresponding gate line 4 and source line 5. The display elements 6 may each comprise a pixel electrode, a select transistor and a hold capacitor when an LCD panel is used as the display panel 1. Alternatively, the display elements 6 may each comprise a light emitting element, a select transistor and a hold capacitor when an OLED display panel is used as the display panel 1. The display panel 1 may comprise various interconnections other than the gate lines 4 and the source lines 5, depending on the configuration of the display elements 6.

In one or more embodiments, the gate driver circuitry 7 is configured to sequentially select the gate lines 4 and drive the selected gate line 4. Drive signals supplied from the processing system 2 may be written into display elements 6 connected to the gate line 4 selected by the gate driver circuitry 7. In one or more embodiments, the image data supplied to the processing system 2 comprise pixel data that describes a grayscale value of each display element 6 and the drive signal supplied to each display element 6 may have a signal level corresponding to the grayscale value described in the pixel data.

The display panel 1 may be adapted to time-division driving. In one or more embodiments, the display panel 1 comprises multiplexers (MUXes) 8 configured to select the source lines 5 to achieve time-division driving. The source lines 5 selected by the respective multiplexers 8 may be connected to the processing system 2 and drive signals may be written into desired display elements 6 via the selected source lines 5. In other embodiments, no multiplexers 8 are disposed in the display panel 1 and time-division driving is not performed. In such embodiments, the source lines 5 may be connected to the processing system 2.

In one or more embodiments, the display panel 1 further comprises sensor electrodes 9. In various embodiments, the sensor electrodes 9 are used for capacitive proximity sensing. While six sensor electrodes 9 are illustrated, the display panel 1 may comprise more than six sensor electrodes 9. Further, the sensor electrodes 9 may be disposed over the entirety of a sensing region of the input device 200. Proximity sensing may comprise sensing an input object, e.g., the input object 140, in the sensing region of the display device 200. Proximity sensing may be achieved through self-capacitance sensing or mutual capacitance sensing. Further, proximity sensing may be achieved based on detected changes in self-capacitances, or absolute capacitances, or mutual capacitances of the respective sensor electrodes 9. The display panel 1 may further comprise transmitter electrodes that are not illustrated. In such embodiments the proximity sensing may be achieved based on mutual capacitances, or transcapacitances, between the transmitter electrodes and the sensor electrodes 9. In one or more embodiments, the sensor electrodes 9 may be used for display updating and capacitive sensing. For example, in embodiments, when the display panel 1 is configured as an LCD panel comprising common electrodes arrayed in rows and columns, the common electrodes may be used as the sensor electrodes 9. In such embodiments, the common electrodes are driven with a common voltage, e.g., a reference voltage, for updating the display panel 1.

In one or more embodiments, the processing system 2 comprises an IC chip that is configured as a touch display drive integration (TDDI) adapted to perform both a display drive operation and a proximity sensing operation. The display drive operation may comprise supplying drive signals to the display elements 6 of the display panel 1 via the source lines 5. The proximity sensing operation may comprise performing proximity sensing based on sensing signals received from the sensor electrodes 9 and generating proximity sensing data indicative of a result of the proximity sensing. In other embodiments, the processing system 2 may comprise more than one IC chips, a first IC chip configured to perform a display drive operation and a second IC chip to perform a proximity sensing operation. In various embodiments, the processing system 2 comprises external connection terminals S1 to Sm for outputting the drive signals to the display panel 1 and external connection terminals RX1 to RXp for receiving the sensing signals from the sensor electrodes 9, where m and p are integers of two or more.

Figure 3:
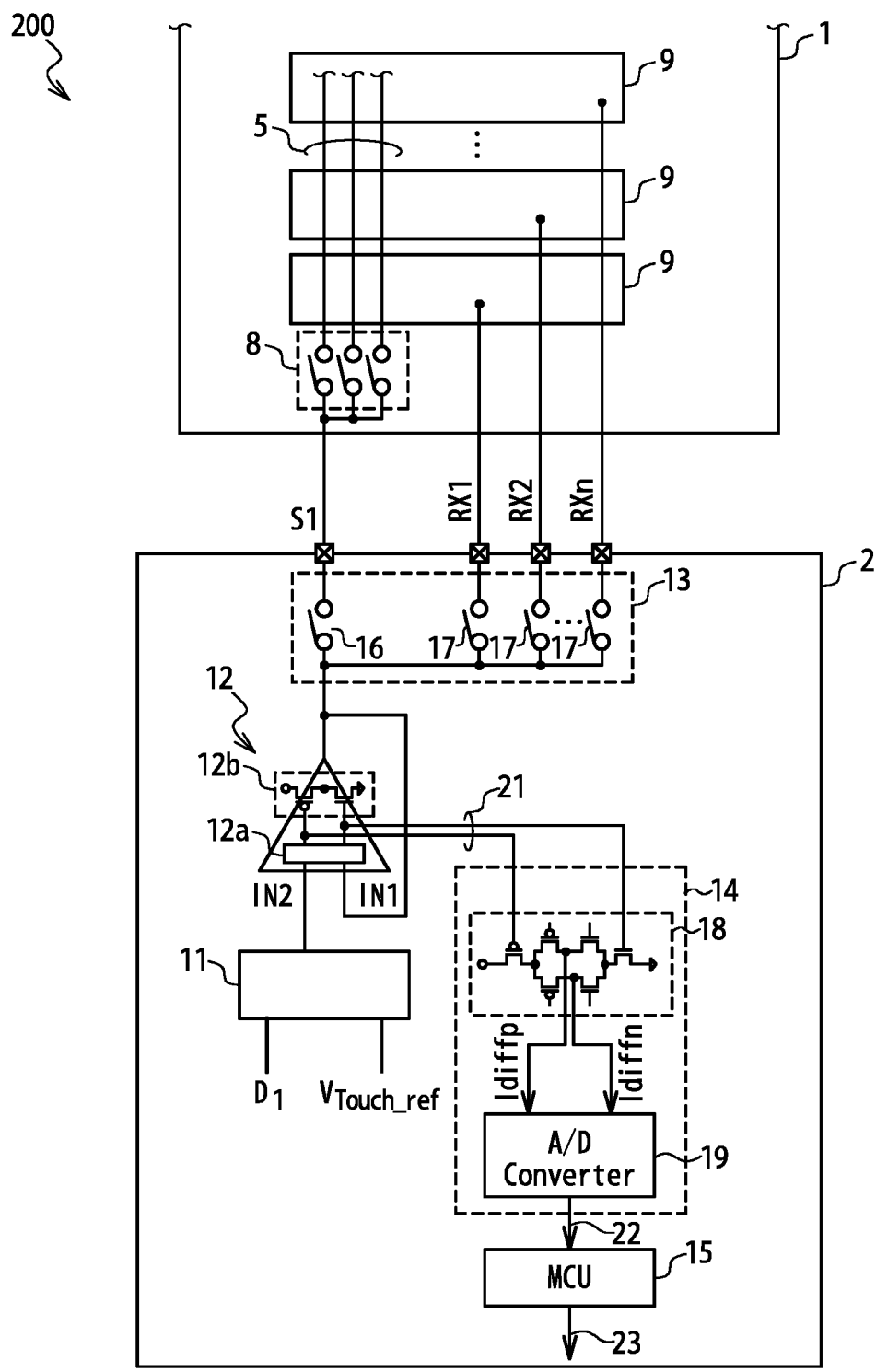
FIG. 3 illustrates an example configuration of a processing system, according to one or more embodiments.

In one or more embodiments, as illustrated in FIG. 3, the processing system 2 comprises voltage output circuitry 11, a source amplifier 12, switch circuitry 13, an analog front end 14 and a micro controller unit (MCU) 15. Illustrated in FIG. 3 is an example configuration of a portion of the processing system 2 related to the external connection terminal S1 and the external connection terminals RX1 to RXn, where n is an integer more than or equal to two and less than p. The external connection terminal S1 may be connected to a source line 5 directly or to one or more source lines 5 via another element such as a multiplexer 8. In the embodiment illustrated in FIG. 3, the external connection terminal S1 is connected to a plurality of source lines 5, in this embodiment, three source lines 5 via the multiplexer 8. The external connection terminal S1 may be directly connected to a source line 5 in embodiments where no multiplexer 8 is disposed in the display panel 1. In one or more embodiments, the external connection terminals RX1 to RXn are respectively connected to sensor electrodes 9 directly or via other elements.

In one or more embodiments, the voltage output circuitry 11 is configured to selectively output a grayscale voltage based on pixel data $D_1$ and a reference voltage $V_{Touch\_ref}$ used for proximity sensing. The voltage output circuitry 11 may comprise one or more of a decoder or a digital-analog converter (DAC) configured to generate the grayscale voltage based on the pixel data $D_1$. The pixel data $D_1$ may describe a grayscale value of a corresponding display element 6 and the voltage output circuitry 11 may be configured to output the grayscale voltage so that the grayscale voltage has a voltage level corresponding to the grayscale value. The reference voltage $V_{Touch\_ref}$ may be a constant voltage or a periodical voltage of a constant periodicity. Alternatively, the reference voltage $V_{Touch\_ref}$ may be aperiodic.

In one or more embodiments, the source amplifier 12 is adapted to both an operation to generate a drive signal to be supplied to a display element 6 in the display drive operation and an operation to generate comparison output signals 21 based on a sensing signal received from a sensor electrode 9 in the proximity sensing operation. The source amplifier 12 may be configured to generate the drive signal based on the grayscale voltage in the display drive operation. In some instances, the grayscale voltage corresponds to pixel data (e.g., the pixel data D1). In other instances, the grayscale voltage corresponds to the pixel data and a reference voltage (e.g., the reference voltage$_{Touch\_ref}$). The grayscale voltage may be supplied from the voltage output circuitry 11. The source amplifier 12 may be configured to generate, in the proximity sensing operation, the comparison output signals 21 based on a comparison between a reference voltage (e.g., the reference voltage $V_{Touch\_ref}$ received from the voltage output circuitry 11) and the voltage level of the sensing signal received from the sensor electrode 9.

In one or more embodiments, the source amplifier 12 comprises a first input IN1, a second input IN2, a differential input stage 12a, and an output stage 12b. The first input IN1 may be connected to the output of the source amplifier 12, and the second input IN2 may be connected to the voltage output circuitry 11. The connection of the output of the source amplifier 12 to the first input IN1 may allow the source amplifier 12 to operate as a voltage follower. The differential input stage 12a may be configured to, in the display drive operation, supply one or more signals to the output stage 12b based on a comparison between the output voltage of the source amplifier 12, which is fed back to the first input IN1, and the grayscale voltage supplied to the second input IN2. The output stage 12b may be configured to output the drive signal based on the output signals of the differential input stage 12a. The differential input stage 12a may be further configured to, in the proximity sensing operation, output the comparison output signals 21 to the analog front end 14 based on a comparison between the voltage level of the sensing signal received from the sensor electrode 9 on the first input IN1 and the reference voltage $V_{Touch\_ref}$ received from the voltage output circuitry 11 on the second input IN2.

In one or more embodiments, the switch circuitry 13 is configured to connect the output of the source amplifier 12 to a selected one of the external connection terminal S1 and the external connection terminals RX1 to RXn. The switch circuitry 13 may comprise an output switch 16 connected between the output of the source amplifier 12 and the external connection terminal S1 and switches 17 connected between the output of the source amplifier 12 and the external connection terminals RX1 to RXn, respectively.

In one or more embodiments, the analog front end 14 is configured to generate digital detection data 22 that comprises information of capacitances of the sensor electrodes 9 based on the comparison output signals 21 received from the source amplifier 12. The analog front end 14 may comprise a mixer 18 and an analog-digital (AD) converter 19. The mixer 18 may be configured to generate differential current signals Idiffp and Idiffn based on the comparison output signals 21 received from the source amplifier 12. The differential current signals Idiffp and Idiffn may have current levels corresponding to the signal levels of the comparison output signals 21. The AD converter 19 may be configured to generate the digital detection data 22 by performing an AD conversion on the differential current signals Idiffp and Idiffn.

In one or more embodiments, the MCU 15 is configured to perform processing on the digital detection data 22 received from the analog front end 14 for the proximity sensing to generate proximity sensing data, which is denoted by numeral 23 in FIG. 3. The proximity sensing data 23 may be returned to the host 3 and used in processing in the host 3. The host 3 may be configured to obtain positional information of the input object from the proximity sensing data 23 and generate, based on the positional information of the input object, image data corresponding to a user interface image to be displayed on the display panel 1.

Figure 4:
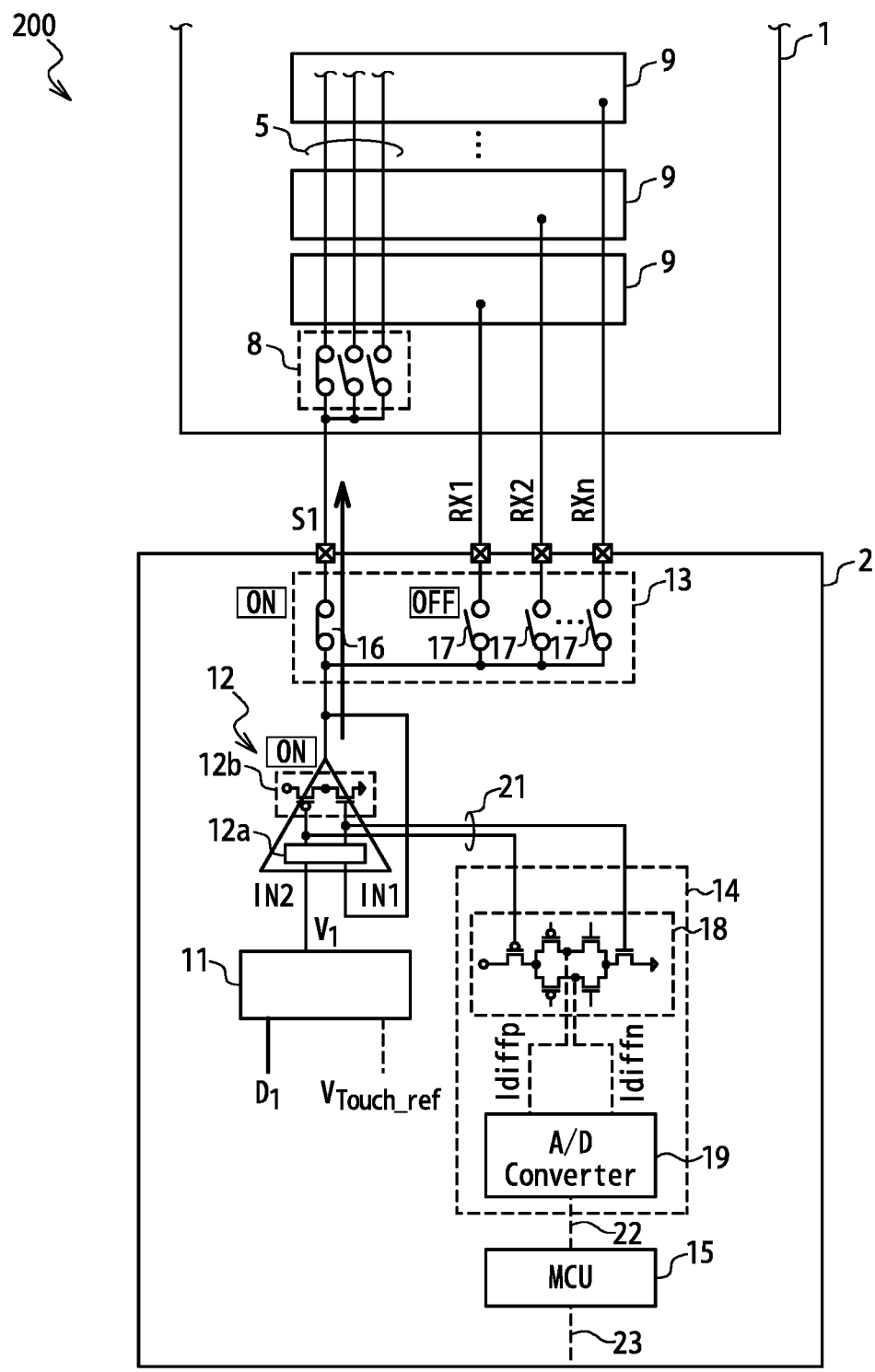
FIG. 4 illustrates an example display drive operation, according to one or more embodiments.

In the display drive operation, as illustrated in FIG. 4, the output switch 16 is turned on in the switch circuitry 13 to connect the output of the source amplifier 12 to the multiplexer 8, in one or more embodiments. In such embodiments, the remaining switches 17 are turned off in the switch circuitry 13 when the switch 16 is turned on. In one or more embodiments, a grayscale voltage $V_1$ that corresponds to the grayscale voltage described in the pixel data $D_1$ is further supplied to the second input IN2 of the source amplifier 12 from the voltage output circuitry 11. The source amplifier 12 may be configured to generate a drive signal having a signal level corresponding to the grayscale voltage $V_1$. The drive signal thus generated may be supplied to a desired display element 6 via the multiplexer 8 and the source line 5 selected by the multiplexer 8.

Figure 5:
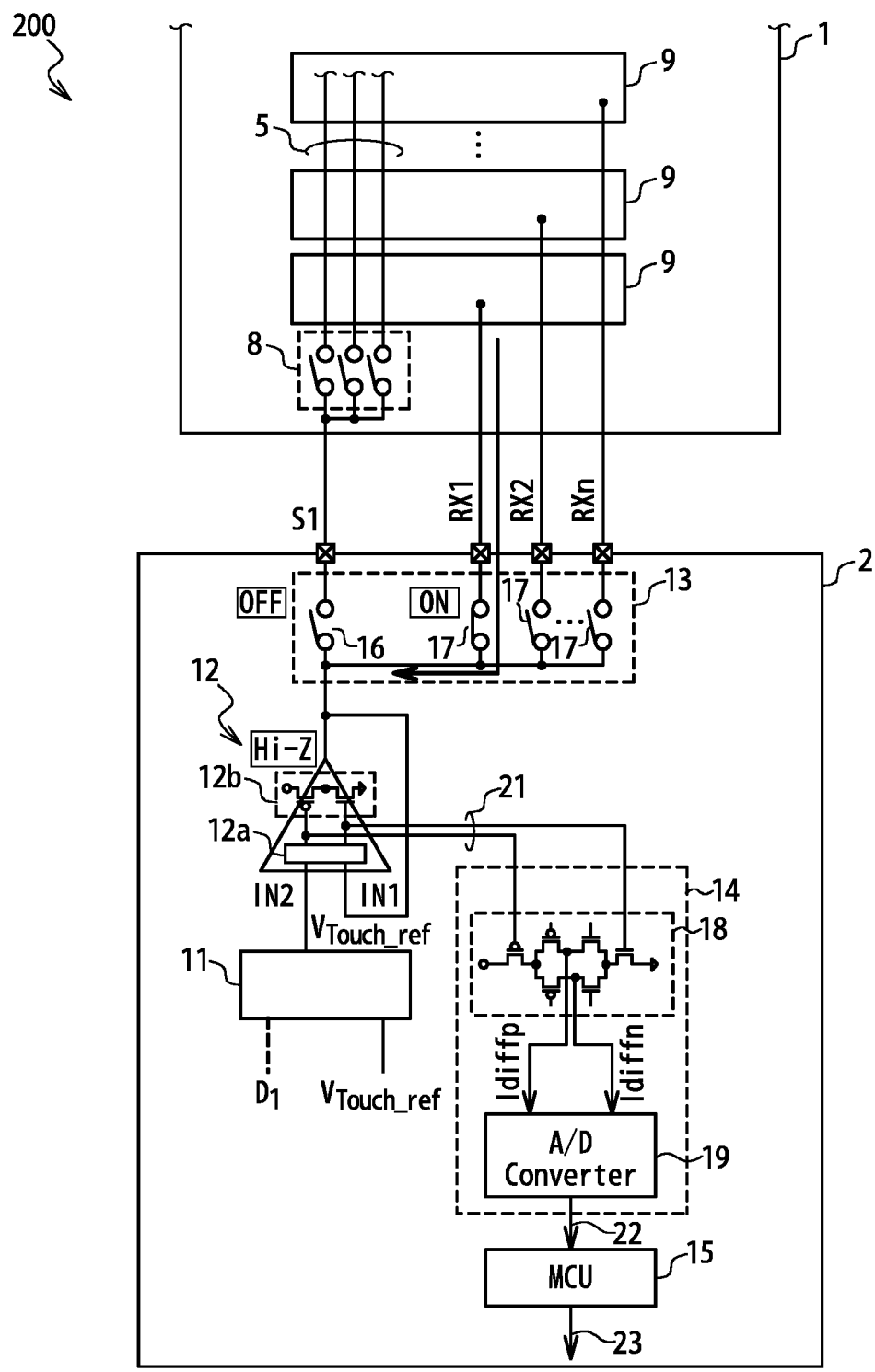
FIG. 5 illustrates an example proximity sensing operation, according to one or more embodiments.

In the proximity sensing operation, as illustrated in FIG. 5, a switch 17 connected to a sensor electrode 9 from which a sensing signal is to be obtained is turned on in the switch circuitry 13, in one or more embodiments. This provides an electrical connection of the sensor electrode 9 to the first input IN1 of the source amplifier 12. Further, while the switch 17 is connected to the sensor electrode 9, the output switch 16 and other switches 17 may be turned off. In one or more embodiments, the operation of the output stage 12b of the source amplifier 12 is further stopped to allow the output stage 12b to place the output of the source amplifier 12 into the high impedance state. In various embodiments, the reference voltage $V_{Touch\_ref}$ is further supplied to the second input IN2 of the source amplifier 12 from the voltage output circuitry 11.

In the proximity sensing operation, the mixer 18 and the differential input stage 12a of the source amplifier 12 may cooperatively operate as a current conveyer configured to generate differential current signals Idiffp and Idiffn corresponding to the current level of the sensing signal obtained from the sensor electrode 9. In one or more embodiments, the source amplifier 12 is configured to generate the comparison output signals 21 based on comparison between the reference voltage $V_{Touch\_ref}$ and the voltage level of the sensing signal from the sensor electrode 9, and the mixer 18 is configured to generate the differential current signals Idiffp and Idiffn so that the differential current signals Idiffp and Idiffn have current levels corresponding to the signal levels of the comparison output signals 21.

In one or more embodiments, the AD converter 19 is configured to generate the digital detection data 22 based on the differential current signals Idiffp and Idiffn thus generated. Sensing signals may be obtained from other sensor electrodes 9 in a similar manner and digital detection data 22 may be generated based on the obtained sensing signals. In one or more embodiments, the MCU 15 is configured to generate proximity sensing data 23 by performing digital processing for proximity sensing based on the digital detection data 22 obtained for desired sensor electrodes 9. The MCU 15 may generate positional information of the input object based on the digital detection data 22, and the proximity sensing data 23 may comprise the positional information thus generated.

Using the source amplifier 12 for both the generation of the drive signals to be supplied to the display elements 6 and the generation of the comparison output signals 21 used for proximity sensing as illustrated in FIGS. 3 and 4 may contribute a circuit size reduction of the processing system 2. This may be effective for a cost reduction of the processing system 2.

Figure 6:
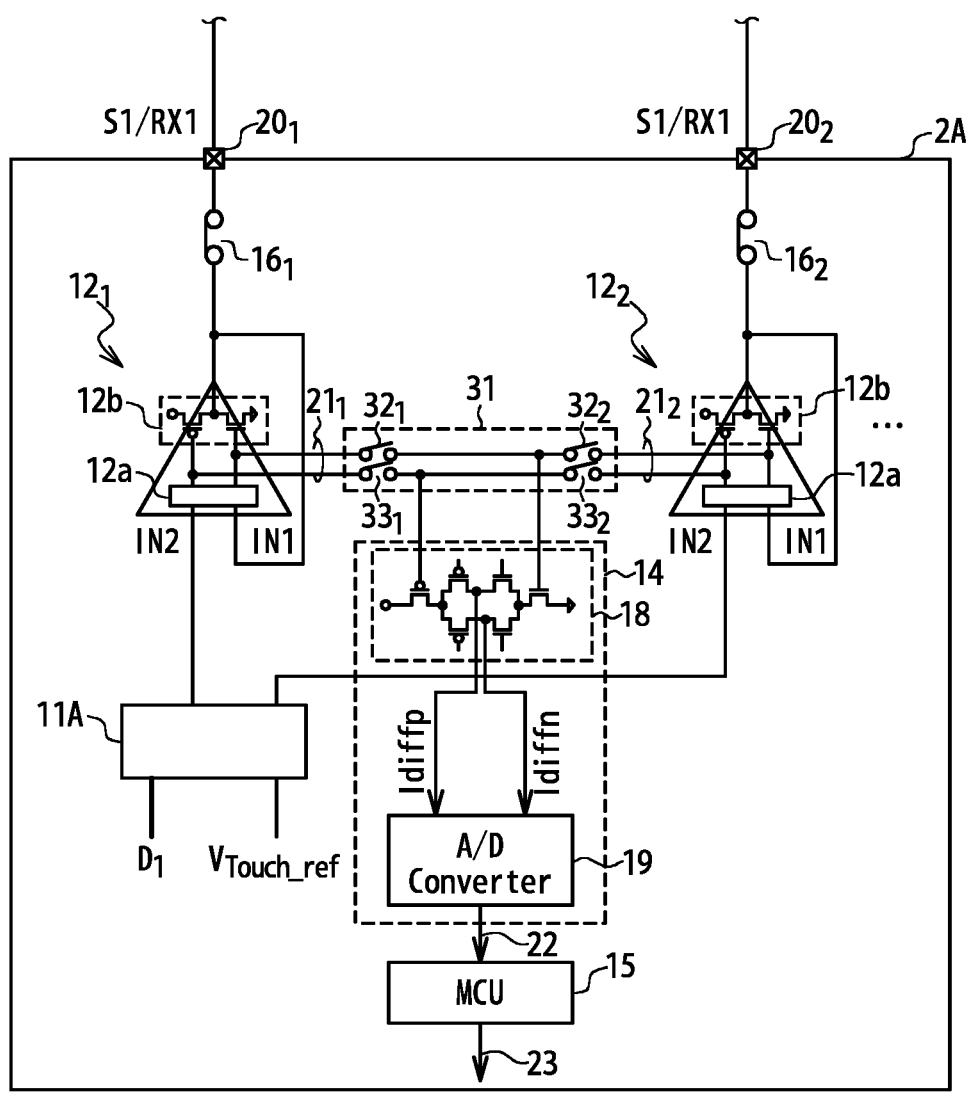
FIG. 6 illustrates an example configuration of a processing system, according to one or more embodiments.

In one or more embodiments, as illustrated in FIG. 6, a processing system 2A is configured so that both external connection terminals $20_1$ and $20_2$ are available for supply of drive signals to display elements 6 of the display panel 1 and obtainment of a sensing signal from a sensor electrode 9. One of the external connection terminals $20_1$ and $20_2$ may be used for supply of drive signals to display elements 6 of the display panel 1 and the other may be used for obtainment of a sensing signal from a sensor electrode 9. Such configuration may effectively improve design flexibility of the display panel 1.

In one or more embodiments, the processing system 2A comprises voltage output circuitry 11A, source amplifiers $12_1$, $12_2$, output switches $16_1$, $16_2$, and switch circuitry 31.

In one or more embodiments, the voltage output circuitry 11A is configured to output one of a grayscale voltage based on pixel data $D_1$ and a reference voltage $V_{Touch\_ref}$ used for proximity sensing to the source amplifier $12_1$ and output the other to the source amplifier $12_2$. The voltage output circuitry 11A may comprise a decoder (or a DAC) configured to generate the grayscale voltage based on the pixel data $D_1$. The grayscale voltage may be supplied to one of the source amplifiers $12_1$ and $12_2$ which is used for the generation of the drive signals to be supplied to the display elements 6, and the reference voltage $V_{Touch\_ref}$ is supplied to the other of the source amplifiers $12_1$ and $12_2$, which is used for generation of comparison output signals 21.

In one or more embodiments, both the source amplifiers $12_1$ and $12_2$ are adapted to both the generation of the drive signals in the display drive operation and the generation of the comparison output signals 21 in the proximity sensing operation. The source amplifiers $12_1$ and $12_2$ may be configured similarly to the source amplifier 12 illustrated in FIG. 3.

In one or more embodiments, the output switches $16_1$ and $16_2$ are connected between the external connection terminals $20_1$, $20_2$ and the outputs of the source amplifiers $12_1$ and $12_2$, respectively. In various embodiments, the output of the source amplifier $12_1$ is connected to the external connection terminal $20_1$ when the output switch $16_1$ is turned on, and the output of the source amplifier $12_2$ is connected to the external connection terminal $20_2$ when the output switch $16_2$ is turned on.

In one or more embodiments, the switch circuitry 31 is configured to selectively connect the source amplifiers $12_1$ and $12_2$ to the mixer 18 of the analog front end 14. In various embodiments, the switch circuitry 31 is configured to connect the mixer 18 of the analog front end 14 to one of the source amplifiers $12_1$ and $12_2$ which is used for the proximity sensing. The switch circuitry 31 comprises switches $32_1$, $33_1$, $32_2$, and $33_2$. The switches $32_1$ and $33_1$ may be connected between the source amplifier $12_1$ and the mixer 18 and the switches $32_2$ and $33_2$ may be connected between the source amplifier $12_2$ and the mixer 18. In various embodiments, comparison output signals $21_1$ are supplied from the source amplifier $12_1$ to the mixer 18 when the switches $32_1$ and $33_1$ are turned on, and comparison output signals $21_2$ are supplied from the source amplifier $12_2$ to the mixer 18 when the switches $32_2$ and $33_2$ are turned on.

Figure 7:
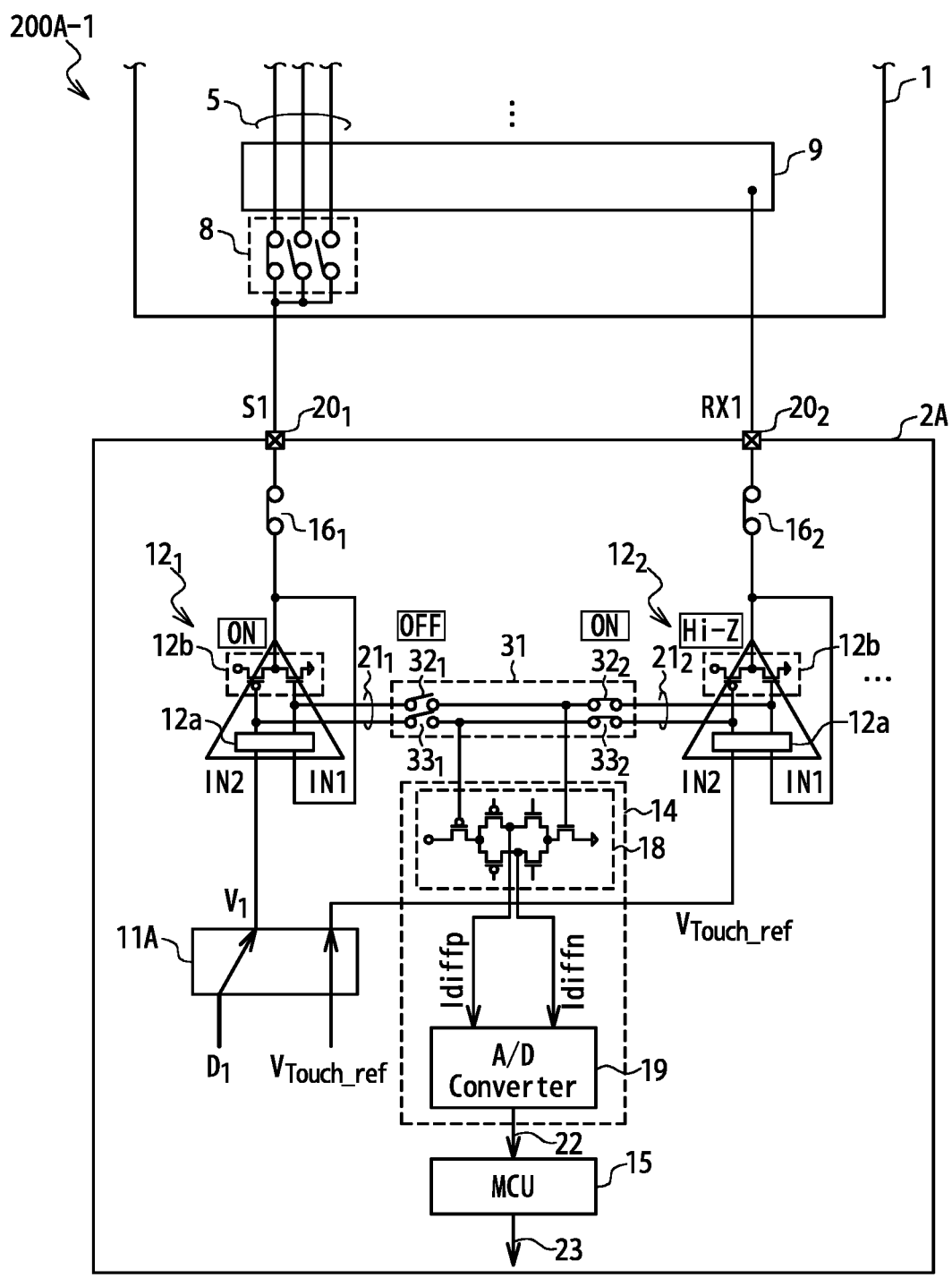
FIG. 7 illustrates an example configuration of an input device, according to one or more embodiments.

Referring to FIG. 7 that illustrates an input device 200A-1, in one or more embodiments, the external connection terminal $20_1$ is connected to a multiplexer 8 of the display panel 1 and the external connection terminal $20_2$ is connected to a sensor electrode 9. The external connection terminal $20_1$ may be connected to a source line 5 when no multiplexer 8 is disposed in the display panel 1.

In one or more embodiments, the source amplifier $12_1$ is used to generate drive signals to be supplied to display elements 6 in the display drive operation. In such embodiments, the output switch $16_1$ may be turned on to connect the output of the source amplifier $12_1$ to the multiplexer 8 or the source line 5. A grayscale voltage $V_1$ corresponding to a grayscale value described in pixel data $D_1$ may be further supplied to the second input IN2 of the source amplifier $12_1$ from the voltage output circuitry 11A. The source amplifier $12_1$ may generate a drive signal having a signal level corresponding to the grayscale voltage $V_1$. The drive signal thus generated may be supplied to a desired display element 6 via the multiplexer 8 and the source line 5 selected by the multiplexer 8. In various embodiments, source lines 5 are sequentially selected by the multiplexer 8 to achieve time-division driving. The pixel data $D_1$ may be successively changed in synchronization with the selection of the source lines 5 to supply desired drive signals to display elements 6 connected to the source lines 5.

In one or more embodiments, the source amplifier $12_2$ is used for generation of the comparison output signals $21_2$ based on a sensing signal obtained from the sensor electrode 9 in the proximity sensing operation. In such embodiments, the output switch $16_2$ may be turned on to connect to the sensor electrode 9 to the first input IN1 of the source amplifier $12_2$. The operation of the output stage $12b$ of the source amplifier $12_2$ may be further stopped to allow the output stage $12b$ to set the output of the source amplifier $12_2$ to the high-impedance state. In one or more embodiments, the reference voltage $V_{Touch\_ref}$ is supplied to the second input IN2 of the source amplifier $12_2$ from the voltage output circuitry 11A. In such embodiments, the comparison output signals $21_2$ may be generated based on a comparison between the reference voltage $V_{Touch\_ref}$ and the voltage level of the sensing signal obtained from the sensor electrode 9 and outputted from the differential input stage $12a$ of the source amplifier $12_2$.

In one or more embodiments, the switches $32_2$ and $33_2$ of the switch circuitry 31 are turned on to supply the comparison output signals $21_2$ to the mixer 18 of the analog front end 14 from the differential input stage $12a$ of the source amplifier $12_2$. Meanwhile, the switches $32_1$ and $33_1$ of the switch circuitry 31 may be turned off to disconnect the source amplifier $12_1$ from the mixer 18. In one or more embodiments, the source amplifier $12_2$ and the mixer 18 cooperatively operate as a current conveyer configured to generate differential current signals Idiffp and Idiffn that correspond to the current level of the sensing signal obtained from the sensor electrode 9. The mixer 18 may be configured to generate the differential current signals Idiffp and Idiffn so that the differential current signals Idiffp and Idiffn have current levels corresponding to the signal levels of the comparison output signals $21_2$ thus generated. The AD converter 19 may be configured to generate the digital detection data 22 based on the differential current signals Idiffp and Idiffn. The digital detection data 22 may be supplied to the MCU 15 and used for digital processing to achieve proximity sensing.

Figure 8:
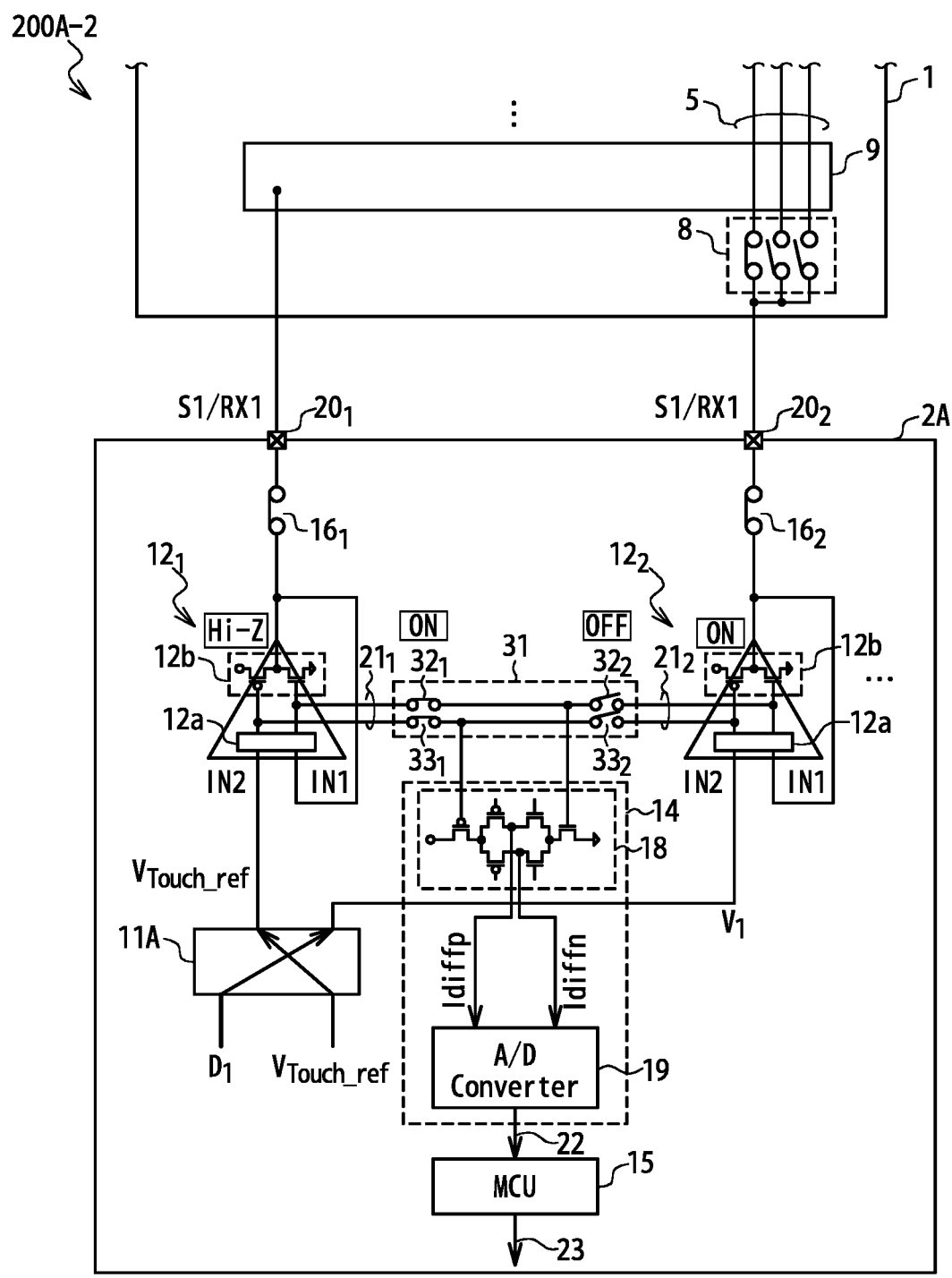
FIG. 8 illustrates an example configuration of an input device, according to one or more embodiments.

Referring to FIG. 8 that illustrates an input device 200A-2, in one or more embodiments, the external connection terminal $20_1$ is connected to a sensor electrode 9 and the external connection terminal $20_2$ is connected to a multiplexer 8 of the display panel 1. The external connection terminal $20_2$ may be connected to a source line 5 when no multiplexer 8 is disposed in the display panel 1. In such embodiments, the source amplifier $12_1$ may be used to generate comparison output signals $21_1$ based on a sensing signal obtained from the sensor electrode 9 and the source amplifier $12_2$ may be used to generate drive signals to be supplied to display elements 6.

In one or more embodiments, the output switch $16_2$ is turned on to connect the output of the source amplifier $12_2$ to the multiplexer 8 or the source line 5 in the display drive operation. In such embodiments, the source amplifier $12_2$ may generate a drive signal having a signal level corresponding to the grayscale voltage $V_1$ received from the voltage output circuitry 11A.

In one or more embodiments, the output switch $16_1$ is turned on to connect to the sensor electrode 9 to the first input IN1 of the source amplifier $12_1$ in the proximity sensing operation. In such embodiments, the output of the source amplifier $12_1$ may be further set to the high impedance state and the reference voltage $V_{Touch\_ref}$ may be supplied to the second input IN2 of the source amplifier $12_1$ from the voltage output circuitry 11A. In various embodiments, the comparison output signals $21_1$ are generated based on a comparison between the reference voltage $V_{Touch\_ref}$ and the voltage level of the sensing signal obtained from the sensor electrode 9 and outputted from the differential input stage $12a$ of the source amplifier $12_1$.

In one or more embodiments, the switches $32_1$ and $33_1$ of the switch circuitry 31 are turned on to supply the comparison output signals $21_1$ to the mixer 18 of the analog front end 14. Meanwhile, the switches $32_2$ and $33_2$ of the switch circuitry 31 may be turned off to disconnect the source amplifier $12_2$ from the mixer 18. In one or more embodiments, the mixer 18 is configured to generate the differential current signals Idiffp and Idiffn so that the differential current signals Idiffp and Idiffn have current levels corresponding to the signal levels of the comparison output signals $21_1$, and the AD converter 19 is configured to generate the digital detection data 22 based on the differential current signals Idiffp and Idiffn. The digital detection data 22 may be supplied to the MCU 15 and used for digital processing to achieve proximity sensing.

The processing system 2A, which is adapted to both the operations illustrated in FIGS. 7 and 8, may effectively improve design flexibility of the display panel 1.

Figure 9:
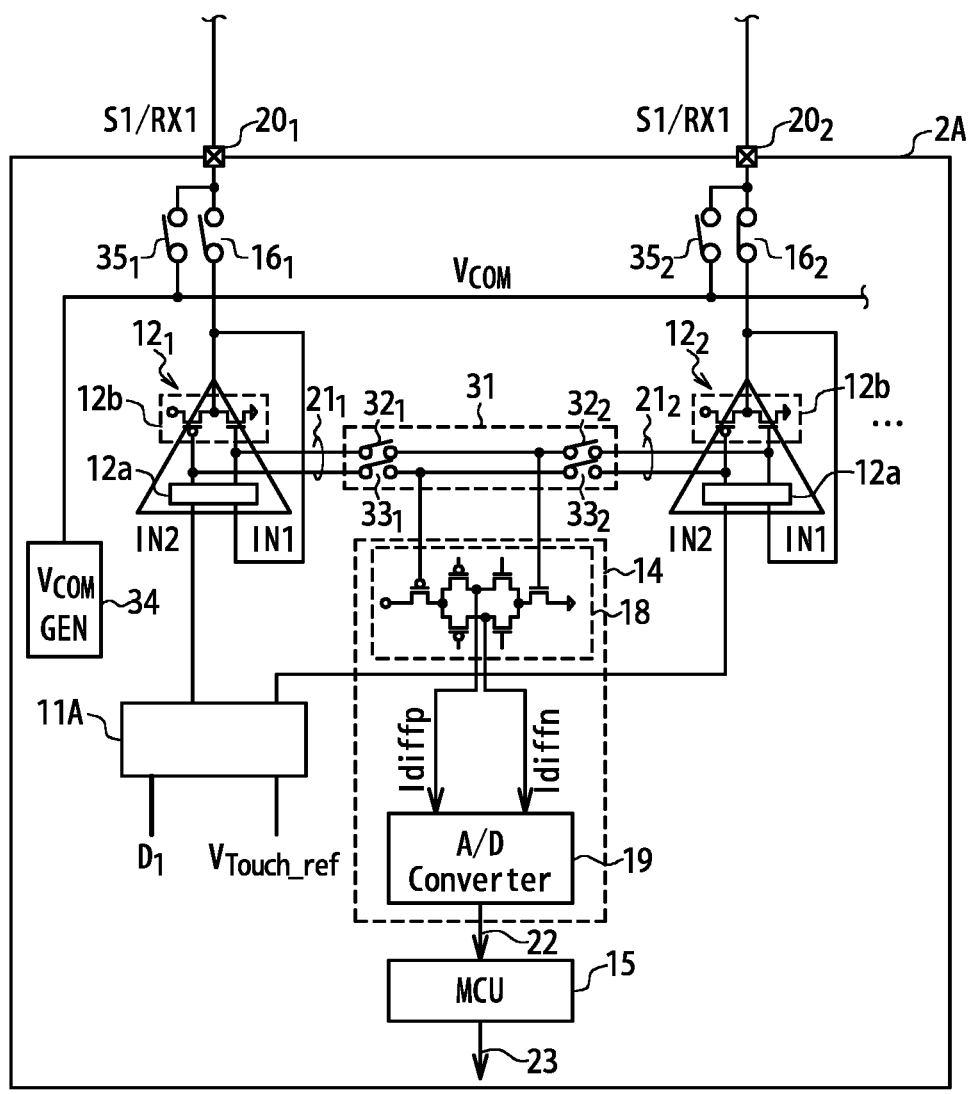
FIG. 9 illustrates an example configuration of a processing system, according to one or more embodiments.

In one or more embodiments, as illustrated in FIG. 9, the processing system 2A further comprises common voltage generator circuitry 34 and VCOM switches $35_1$ and $35_2$. This configuration may be used when the display panel 1 comprises an LCD panel in which common electrodes are arrayed in rows and columns and the common electrodes are used as sensor electrodes 9 and as a reference for the pixel electrodes of the display elements 6. In various embodiments, the common voltage generator circuitry 34 is configured to generate a common voltage $V_{COM}$. The VCOM switches $35_1$ and $35_2$ may be connected between the external connection terminals $20_1$ and $20_2$ and the common voltage generator circuitry 34, respectively.

In one or more embodiments, the external connection terminal $20_2$ is connected to a sensor electrode 9 that is also used as a common electrode, and the VCOM switch $35_2$ is turned on to supply the common voltage $V_{COM}$ to the sensor electrode 9 in the display drive operation. In other embodiments, the external connection terminal $20_1$ is connected to a sensor electrode 9 that is also used as a common electrode, and the VCOM switch $35_1$ is turned on to supply the common voltage $V_{COM}$ to the sensor electrode 9 in the display drive operation.

Figure 10:
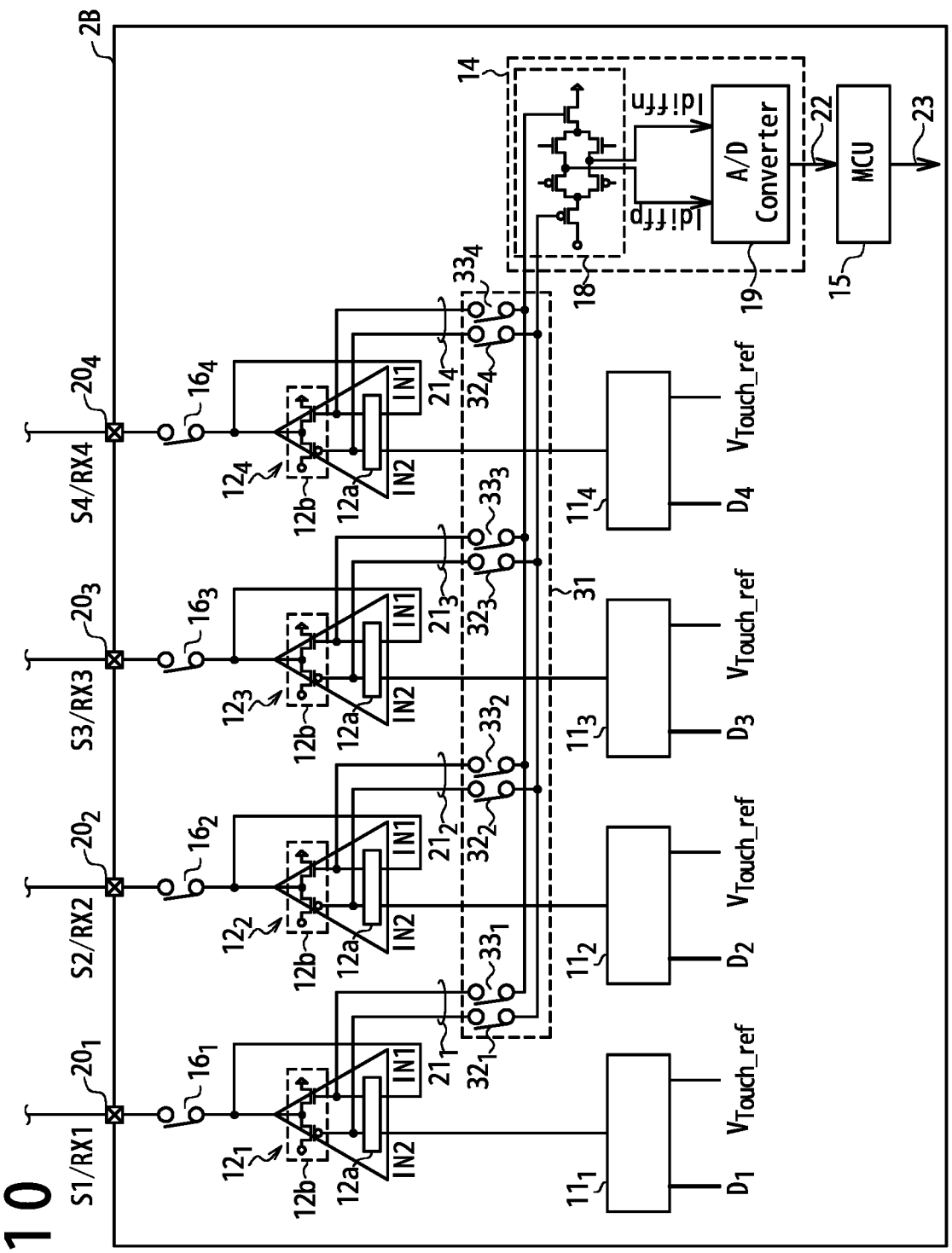
FIG. 10 illustrates an example configuration of a processing system, according to one or more embodiments.

In one or more embodiments, as illustrated in FIG. 10, a processing system 2B is configured so that all of a plurality of external connection terminals 20, four external connection terminals $20_1$ to $20_4$ in FIG. 10, are available for supply of drive signals to display elements 6 of the display panel 1 and obtainment of sensing signals from sensor electrodes 9. In various embodiments, the processing system 2B is configured so that the number of ones of the external connection terminals $20_1$ to $20_4$ which are used to supply drive signals to display elements 6 of the display panel 1 is variable. In various embodiments, the processing system 2B is configured so that the number of ones of the external connection terminals $20_1$ to $20_4$ which are used to obtain sensing signals from sensor electrodes 9 is variable. Such configuration may effectively improve design flexibility of the display panel 1.

In one or more embodiments, the processing system 2B comprises a plurality of voltage output circuitries 11, a plurality of source amplifiers 12, a plurality of output switches 16, an analog front end 14, and an MCU 15. Illustrated in FIG. 10 is the configuration in which the numbers of the plurality of external connection terminals 20, the plurality of voltage output circuitries 11, the plurality of source amplifiers 12 and the plurality of output switches 16 are four. The numbers of the external connection terminals 20, the voltage output circuitries 11, the source amplifiers 12 and the output switches 16 for one analog front end 14 may be variously modified.

In one or more embodiments, the voltage output circuitries $11_1$ to $11_4$ are respectively configured to selectively output grayscale voltages based on pixel data $D_1$ to $D_4$ and the reference voltage $V_{Touch\_ref}$ used for proximity sensing. The pixel data $D_i$ may describe a grayscale value of a display element 6 connected to a source line 5 associated with the external connection terminal $20_i$. The voltage output circuitry $11_i$ may be configured to output the grayscale voltage so that the grayscale voltage has a voltage level corresponding to the grayscale value described in the pixel data $D_i$.

In one or more embodiments, each source amplifier $12_i$ is adapted to generate both of drive signals to be supplied to display elements 6 in the display drive operation and generate comparison output signals $21_i$ based on a sensing signal received from a sensor electrode 9 in the proximity sensing operation. In various embodiments, the source amplifier $12_i$ may generate a drive signal based on a grayscale voltage received from the voltage output circuitry $11_i$ in the display drive operation. In various embodiments, the source amplifier $12_i$ may generate the comparison output signals $21_i$ based on a comparison between the reference voltage $V_{Touch\_ref}$ received from the voltage output circuitry $11_i$ and the sensing signal received from the sensor electrode 9 in the proximity sensing operation. Each source amplifier $12_i$ may be configured similarly to the source amplifier 12 illustrated in FIG. 3.

In one or more embodiments, the output switches $16_1$ to $16_4$ are connected between the outputs of the source amplifiers $12_1$ to $12_4$ and the external connection terminals $20_1$ to $20_4$, respectively. In such embodiments, the output of the source amplifier $12_i$ is connected to the external connection terminal $20_i$ when the output switch $16_i$ is turned on.

In one or more embodiments, the switch circuitry 31 is configured to selectively connect the source amplifiers $12_1$ to $12_4$ to the mixer 18 of the analog front end 14. In various embodiments, the switch circuitry 31 is configured to connect one of the source amplifiers $12_1$ to $12_4$ to the mixer 18 of the analog front end 14, the one being used for proximity sensing. The switch circuitry 31 may comprise switches $32_1$ to $32_4$ and $33_1$ to $33_4$. The switches $32_i$ and $33_i$ may be connected between the source amplifier $12_i$ and the mixer 18. In some embodiments, the comparison output signals $21_i$ can be supplied to the mixer 18 from the source amplifier $12_i$ when switches $32_i$ and $33_i$ are turned on.

In one or more embodiments, one or more of the source amplifiers $12_1$ to $12_4$ which are used for the display drive operation receive grayscale voltages from the associated voltage output circuitries 11 and generate drive signals having signal levels corresponding to the grayscale voltages. The drive signals thus generated may be supplied to desired display elements 6 via the corresponding multiplexers 8 and the source lines 5 selected by the multiplexers 8.

In one or more embodiments, one or more of the source amplifiers $12_1$ to $12_4$ which are used for the proximity sensing operation receive the reference voltage $V_{Touch\_ref}$ from the associated voltage output circuitries 11 and generate comparison output signals 21 based on a comparison between the voltage levels received from sensing signals from sensor electrodes 9 and the reference voltage $V_{Touch\_ref}$. The analog front end 14 may be configured to generate digital detection data 22 comprising information of the capacitances of the sensor electrodes 9 based on the comparison output signals 21 received from the source amplifiers 12.

In one or more embodiments, as illustrated in FIG. 11, the source amplifiers $12_1$ and $12_4$ are used for the display drive operation and the source amplifiers $12_2$ and $12_3$ are used for the proximity sensing operation. In such embodiments, the external connection terminals $20_1$ and $20_4$ are connected to multiplexers 8 of the display panel 1 and the external connection terminals $20_2$ and $20_3$ are connected to sensor electrodes 9. The external connection terminals $20_1$ and $20_4$ may be connected to source lines 5 when no multiplexers 8 are disposed in the display panel 1.

In one or more embodiments, the output switches $16_1$ and $16_4$ are turned on to connect the outputs of the source amplifiers $12_1$ and $12_4$ to the multiplexers 8 or the source lines 5 in the display drive operation. In various embodiments, the grayscale voltages $V_1$ and $V_4$ corresponding to grayscale values described in the pixel data $D_1$ and $D_4$ may be further supplied to the second inputs IN2 of the source amplifiers $12_1$ and $12_4$ from the voltage output circuitries $11_1$ and $11_4$, respectively. In such embodiments, the source amplifiers $12_1$ and $12_4$ generate drive signals having signal levels corresponding to the grayscale voltages $V_1$ and $V_4$. The drive signals thus generated may be supplied to desired display elements 6 via the multiplexers 8 connected to the external connection terminals $20_1$ and $20_4$ and the source lines 5 selected by these multiplexers 8. The source lines 5 may be sequentially selected by the multiplexers 8 to achieve time-division driving. In such embodiments, the pixel data $D_1$ and $D_4$ may be sequentially changed in synchronization with the selection of the source lines 5 to supply desired drive signals to the display elements 6 connected to the respective source lines 5.

In one or more embodiment, in the proximity sensing operation for a sensor electrode 9 connected to the external connection terminal $20_2$, the output switch $16_2$ is turned on to connect the sensor electrode 9 to the first input terminal IN1 of the source amplifier $12_2$. The operation of the output stage 12b of the source amplifier $12_2$ may be further stopped to allow the output stage 12b to set the output of the source amplifier $12_2$ to the high-impedance state. In one or more embodiments, the reference voltage $V_{Touch\_ref}$ is supplied to the second input IN2 of the source amplifier $12_2$ from the voltage output circuitry $11_2$. In such embodiments, the comparison output signals $21_2$ may be generated based on a comparison between the reference voltage $V_{Touch\_ref}$ and the voltage level of the sensing signal obtained from the sensor electrode 9 and outputted from the differential input stage 12a of the source amplifier $12_2$.

In one or more embodiments, the switches $32_2$ and $33_2$ of the switch circuitry 31 are turned on, and the comparison output signals $21_2$ are supplied to the mixer 18 of the analog front end 14 from the differential input stage 12a of the source amplifier $12_2$. Other switches 32 and 33 of the switch circuitry 31 may be turned off to disconnect the source amplifiers $12_1$, $12_3$ and $12_4$ from the mixer 18. The mixer 18 may generate differential current signals Idiffp and Idiffn having current levels corresponding to the signal levels of the comparison output signals $21_2$ thus generated. The AD converter 19 may generate the digital detection data 22 based on the differential current signals Idiffp and Idiffn.

In one or more embodiments, when the proximity sensing operation is performed for the sensor electrode 9 connected to the external connection terminal $20_3$, a similar operation is performed using the source amplifier $12_3$ in place of the source amplifier $12_2$. In such embodiments, the output switch $16_3$ may be turned on to connect the sensor electrode 9 to the first input terminal IN1 of the source amplifier $12_3$. The operation of the output stage 12b of the source amplifier $12_3$ may be further stopped to allow the output stage 12b to set the output of the source amplifier $12_3$ to the high-impedance state. In one or more embodiments, the reference voltage $V_{Touch\_ref}$ is supplied to the second input IN2 of the source amplifier $12_3$ from the voltage output circuitry $11_3$. In such embodiments, the comparison output signals $21_3$ may be generated based on a comparison between the reference voltage $V_{Touch\_ref}$ and the voltage level of the sensing signal obtained from the sensor electrode 9 and outputted from the differential input stage 12a of the source amplifier $12_3$.

In one or more embodiments, the switches $32_3$ and $33_3$ of the switch circuitry 31 are turned on, and the comparison output signals $21_3$ are supplied to the mixer 18 of the analog front end 14 from the differential input stage 12a of the source amplifier $12_3$. Other switches 32 and 33 of the switch circuitry 31 may be turned off to disconnect the source amplifiers $12_1$, $12_2$ and $12_4$ from the mixer 18. The mixer 18 may generate differential current signals Idiffp and Idiffn having current levels corresponding to the signal levels of the comparison output signals $21_3$ thus generated. The AD converter 19 may generate the digital detection data 22 based on the differential current signals Idiffp and Idiffn.

In one or more embodiments, the thus-generated digital detection data 22, which are associated with the sensor electrodes 9 connected to the external connection terminals $20_2$ and $20_3$, may be supplied to the MCU 15 and used for digital processing to achieve proximity sensing.

Figure 12:
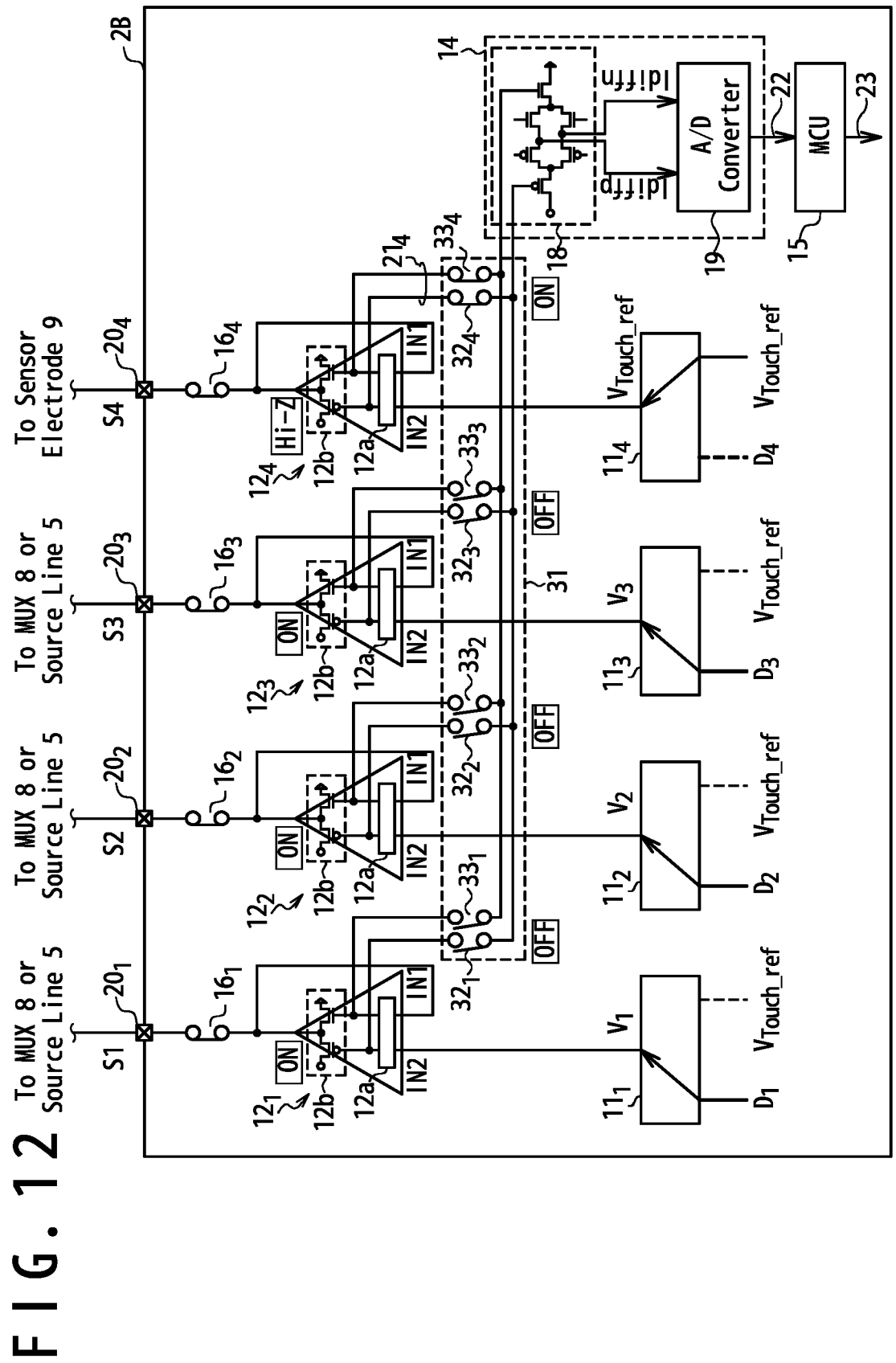
FIG. 12 illustrates an example operation of a processing system, according to one or more embodiments.

In other embodiments, as illustrated in FIG. 12, the external connection terminals $20_1$ to $20_3$ are connected to multiplexers 8 of the display panel 1 and the external connection terminal $20_4$ is connected to a sensor electrode 9. The external connection terminals $20_1$ to $20_3$ may be connected to source lines 5 when no multiplexers 8 are disposed in the display panel 1.

In one or more embodiments, the output switches $16_1$ to $16_3$ are turned on to connect the outputs of the source amplifiers $12_1$ to $12_3$ to the multiplexers 8 or the source lines 5 in the display drive operation. In various embodiments, the grayscale voltages $V_1$ to $V_3$ corresponding to grayscale values described in the pixel data $D_1$ to $D_3$ may be further supplied to the second inputs IN2 of the source amplifiers $12_1$ to $12_3$ from the voltage output circuitries $11_1$ to $11_3$, respectively. In such embodiments, the source amplifiers $12_1$ to $12_3$ generate drive signals having signal levels corresponding to the grayscale voltages $V_1$ to $V_3$. The drive signals thus generated may be supplied to desired display elements 6 via the multiplexers 8 connected to the external connection terminals $20_1$ to $20_3$ and the source lines 5 selected by these multiplexers 8. The source lines 5 may be sequentially selected by the multiplexers 8 to achieve time-division driving. In such embodiments, the pixel data $D_1$ to $D_3$ may be sequentially changed in synchronization with the selection of the source lines 5 to supply desired drive signals to the display elements 6 connected to the respective source lines 5.

In one or more embodiment, in the proximity sensing operation for a sensor electrode 9 connected to the external connection terminal $20_4$, the output switch $16_4$ is turned on to connect the sensor electrode 9 to the first input terminal IN1 of the source amplifier $12_4$. The operation of the output stage 12b of the source amplifier $12_4$ may be further stopped to allow the output stage 12b to set the output of the source amplifier $12_4$ to the high-impedance state. In one or more embodiments, the reference voltage $V_{Touch\_ref}$ is supplied to the second input IN2 of the source amplifier $12_4$ from the voltage output circuitry $11_4$. In such embodiments, the comparison output signals $21_4$ may be generated based on a comparison between the reference voltage $V_{Touch\_ref}$ and the voltage level of the sensing signal obtained from the sensor electrode 9 and outputted from the differential input stage 12a of the source amplifier $12_4$.

In one or more embodiments, the switches $32_4$ and $33_4$ of the switch circuitry 31 are turned on, and the comparison output signals $21_4$ are supplied to the mixer 18 of the analog front end 14 from the differential input stage 12a of the source amplifier $12_4$. Other switches 32 and 33 of the switch circuitry 31 may be turned off to disconnect the source amplifiers $12_1$ to $12_3$ from the mixer 18. The mixer 18 may generate differential current signals Idiffp and Idiffn having current levels corresponding to the signal levels of the comparison output signals $21_4$ thus generated. The AD converter 19 may generate the digital detection data 22 based on the differential current signals Idiffp and Idiffn. In one or more embodiments, the thus-generated digital detection data 22 may be supplied to the MCU 15 and used for digital processing to achieve proximity sensing.

Figure 13:
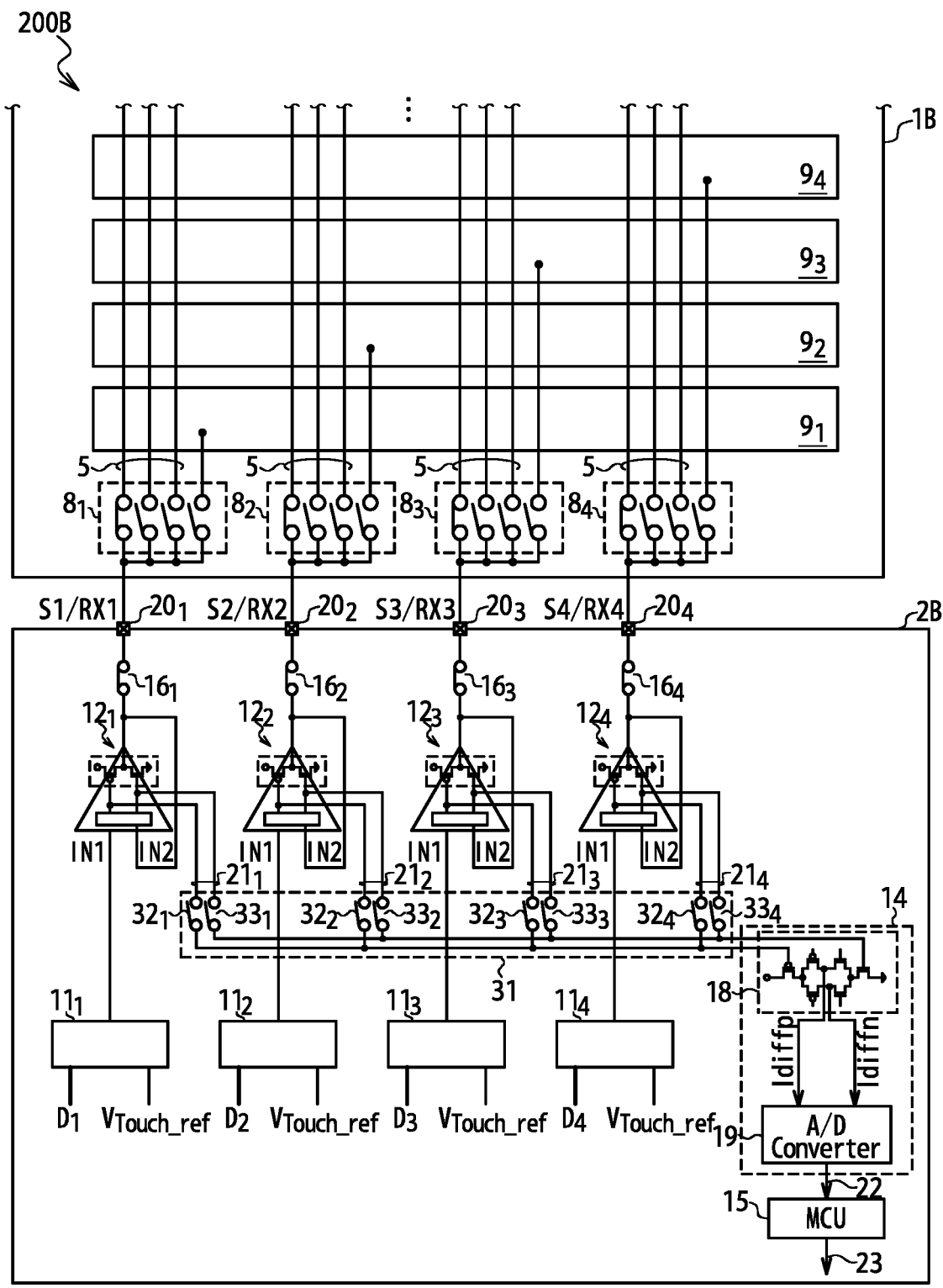
FIG. 13 illustrates an example configuration of an input device, according to one or more embodiments.

Referring to FIG. 13 that illustrates an input device 200B, in one or more embodiments, a processing system 2B is connected to a display panel 1B in which each multiplexer $8_i$ is configured to select a plurality of source lines 5 and a sensor electrode $9_i$. Each multiplexer $8_i$ may be configured to connect a selected one of the plurality of source lines 5 and the sensor electrode $9_i$ to the corresponding external connection terminal $20_i$.

In one or more embodiments, the output switches $16_1$ to $16_4$ are turned on to connect the outputs of the source amplifiers $12_1$ to $12_4$ to the multiplexers 8 in the display drive operation. In various embodiments, the grayscale voltages $V_1$ to $V_4$ corresponding to grayscale values described in the pixel data $D_1$ to $D_4$ may be further supplied to the second inputs IN2 of the source amplifiers $12_1$ to $12_4$ from the voltage output circuitries $11_1$ to $11_4$, respectively. In such embodiments, the source amplifiers $12_1$ to $12_4$ generate drive signals having signal levels corresponding to the grayscale voltages $V_1$ to $V_4$. The drive signals thus generated may be supplied to desired display elements 6 via the multiplexers 8 connected to the external connection terminals $20_1$ to $20_4$ and the source lines 5 selected by these multiplexers 8. The source lines 5 may be sequentially selected by the multiplexers 8 to achieve time-division driving. In such embodiments, the pixel data $D_1$ to $D_4$ may be sequentially changed in synchronization with the selection of the source lines 5 to supply desired drive signals to the display elements 6 connected to the respective source lines 5.

In one or more embodiments, in the proximity sensing operation for the sensor electrode $9_i$ connected to the external connection terminal $20_i$, the output switch $16_i$ is turned on and the sensor electrode $9_i$ is selected by the multiplexer $8_i$. This connects the sensor electrode $9_i$ to the first input IN1 of the source amplifier $12_i$. The operation of the output stage 12b of the source amplifier $12_i$ may be further stopped to allow the output stage 12b to set the output of the source amplifier $12_i$ to the high-impedance state. In one or more embodiments, the reference voltage $V_{Touch\_ref}$ is supplied to the second input IN2 of the source amplifier $12_i$ from the voltage output circuitry $11_i$. In such embodiments, the comparison output signals $21_i$ may be generated based on a comparison between the reference voltage $V_{Touch\_ref}$ and the voltage level of the sensing signal obtained from the sensor electrode $9_i$ and outputted from the differential input stage $12a$ of the source amplifier $12_i$.

In one or more embodiments, the switches $32_i$ and $33_i$ of the switch circuitry 31 are turned on, and the comparison output signals $21_i$ are supplied to the mixer 18 of the analog front end 14 from the differential input stage $12a$ of the source amplifier $12_i$. Other switches 32 and 33 of the switch circuitry 31 may be turned off to disconnect other source amplifiers 12 from the mixer 18. The mixer 18 may generate differential current signals Idiffp and Idiffn having current levels corresponding to the signal levels of the comparison output signals $21_i$ thus generated. The AD converter 19 may generate the digital detection data 22 based on the differential current signals Idiffp and Idiffn.

In one or more embodiments, the digital detection data 22 obtained for the sensor electrodes $9_1$ to $9_4$ are supplied to the MCU 15 and used for digital processing to achieve proximity sensing.

The use of the configuration illustrated in FIG. 13 may enable supplying drive signals to an increased number of source lines 5 and/or obtaining sensing signals from an increased number of sensor electrodes 9 with a reduced number of external connection terminals 20.

Figure 14:
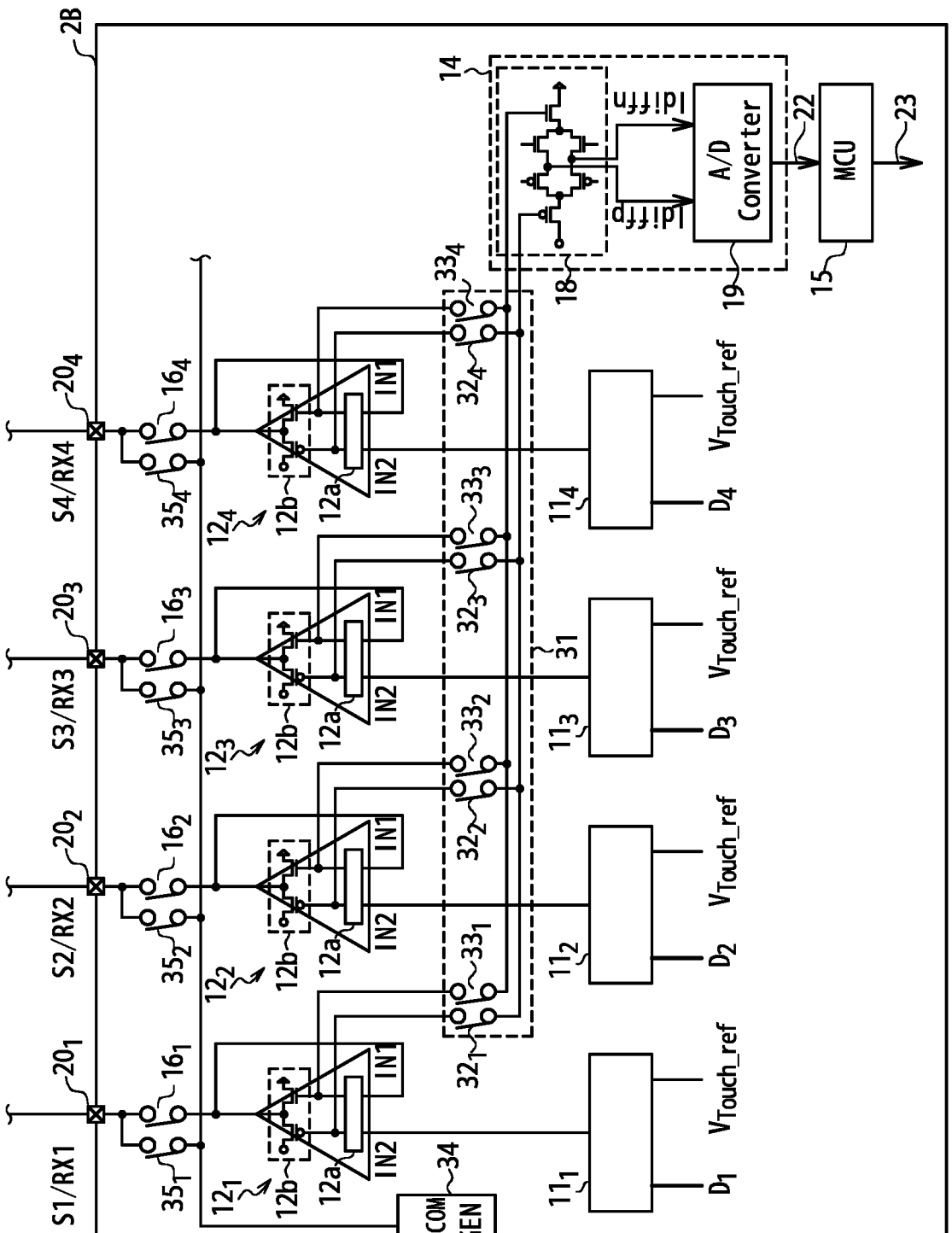
FIG. 14 illustrates an example configuration of a processing system, according to one or more embodiments.

In one or more embodiments, as illustrated in FIG. 14, the processing system 2B further comprises common voltage generator circuitry 34 and VCOM switches $35_1$ to $35_4$. This configuration may be used when the display panel 1 comprises an LCD panel in which common electrodes are arrayed in rows and columns and the common electrodes are used as sensor electrodes 9. In one or more embodiments, the external connection terminal $20_i$ is connected to a sensor electrode 9 that is also used as a common electrode, and the VCOM switch $35_i$ is turned on to supply the common voltage $V_{COM}$ to the sensor electrode 9 in the display drive operation.

Although various embodiments have been specifically described in the above, a person skilled in the art would appreciate that the technologies disclosed herein may be implemented with various modifications.

What is claimed is:

1. A processing system, comprising:
a first source amplifier comprising a first input electrically connectable to a first sensor electrode of a display panel, the first source amplifier configured to:
generate a first drive signal based on a first grayscale voltage corresponding to first pixel data; and
generate a first comparison output signal based on a first sensor signal from the first sensor electrode and a reference voltage; and
an analog front end configured to generate first digital detection data for proximity sensing based on the first comparison output signal.

2. The processing system according to claim 1, further comprising voltage output circuitry configured to selectively supply the first grayscale voltage and the reference voltage to the first source amplifier.

3. The processing system according to claim 2, wherein selectively supplying the first grayscale voltage and the reference voltage comprises:

supplying the first grayscale voltage to a second input of the first source amplifier in a display drive operation; and
supplying the reference voltage to the second input of the first source amplifier in a proximity sensing operation.

4. The processing system according to claim 1, wherein the first source amplifier comprises:
a differential input stage comprising the first input and a second input configured to receive the first grayscale voltage and the reference voltage; and
an output stage connected to the differential input stage and configured to output the first drive signal,
wherein the first comparison output signal is outputted from the differential input stage.

5. The processing system according to claim 1, further comprising:
a first external connection terminal to be connected to a source line of the display panel;
a second external connection terminal to be connected to the first sensor electrode of the display panel; and
first switch circuitry configured to selectively connect an output of the first source amplifier to the first external connection terminal and connect the first input of the first source amplifier to the second external connection terminal.

6. The processing system according to claim 5, wherein the first switch circuitry is configured to:
connect the output of the first source amplifier to the first external connection terminal to supply the generated first drive signal to the source line of the display panel in a display drive operation; and
connect the first input of the first source amplifier to the second external connection terminal to receive the first sensor signal from the first sensor electrode of the display panel for the generation of the first comparison output signal in a proximity sensing operation.

7. The processing system according to claim 1, wherein the first source amplifier comprises an output connected to the first input of the first source amplifier.

8. The processing system according to claim 1, further comprising:
a second source amplifier comprising a third input electrically connectable to a second sensor electrode of the display panel, the second source amplifier configured to:
generate a second drive signal based on a second grayscale voltage corresponding to second pixel data; and
generate a second comparison output signal based on a second sensor signal from the second sensor electrode and the reference voltage,
wherein the analog front end is further configured to generate second digital detection data based on the second comparison output signal outputted from the second source amplifier.

9. The processing system according to claim 8, further comprising:
second switch circuitry configured to selectively connect the first source amplifier and the second source amplifier to the analog front end.

10. The processing system according to claim 8, further comprising voltage output circuitry configured to selectively perform a first operation and a second operation,
wherein the first operation comprises:
supplying the first grayscale voltage to a second input of the first source amplifier; and supplying the reference voltage to a fourth input of the second source amplifier, wherein the second operation comprises:
supplying the second grayscale voltage to the fourth input of the second source amplifier based on the first pixel data; and
supplying the reference voltage to the second input of the first source amplifier.

11. The processing system according to claim 8, further comprising:
a first external connection terminal to be connected to an output of the first source amplifier; and
a second external connection terminal to be connected to an output of the second source amplifier.

12. The processing system according to claim 11, further comprising voltage output circuitry configured to:
when the first external connection terminal is connected to a first source line of the display panel and the second external connection terminal is connected to the second sensor electrode of the display panel, supply the first grayscale voltage to a second input of the first source amplifier and supply the reference voltage to a fourth input of the second source amplifier; and
when the second external connection terminal is connected to a second source line of the display panel and the first external connection terminal is connected to the first sensor electrode of the display panel, supply the second grayscale voltage to the fourth input of the second source amplifier and supply the reference voltage to the second input of the first source amplifier.

13. The processing system according to claim 8, wherein the first input of the first source amplifier is connected to an output of the first source amplifier, and
wherein the third input of the second source amplifier is connected to an output of the second source amplifier.

14. The processing system according to claim 8, further comprising:
first voltage output circuitry configured to selectively supply the first grayscale voltage and the reference voltage to a second input of the first source amplifier; and
second voltage output circuitry configured to selectively supply the second grayscale voltage and the reference voltage to a fourth input of the second source amplifier.

15. The processing system according to claim 14, further comprising:
a first external connection terminal to be connected to an output of the first source amplifier,
wherein the first input of the first source amplifier is connected to the output of the first source amplifier,
wherein the first voltage output circuitry is configured to supply the first grayscale voltage to the second input of the first source amplifier when the first external connection terminal is connected to a first source line of the display panel, and
wherein the first voltage output circuitry is further configured to supply the reference voltage to the second input of the first source amplifier when the first external connection terminal is connected to the first sensor electrode of the display panel.

16. The processing system according to claim 15, further comprising:
a second external connection terminal to be connected to an output of the second source amplifier,
wherein the third input of the second source amplifier is connected to the output of the second source amplifier, wherein the second voltage output circuitry is configured to supply the second grayscale voltage to the fourth input of the second source amplifier when the second external connection terminal is connected to a second source line of the display panel, and
wherein the second voltage output circuitry is configured to supply the reference voltage to the fourth input of the second source amplifier when the second external connection terminal is connected to the second sensor electrode of the display panel.

17. An input device, comprising:
a display panel comprising a first sensor electrode; and
a processing system comprising:
a first source amplifier comprising a first input electrically connectable to the first sensor electrode, the first source amplifier configured to:
generate a first drive signal based on a first grayscale voltage corresponding to first pixel data; and
generate a first comparison output signal based on a first sensor signal from the first sensor electrode and a reference voltage; and
an analog front end configured to generate a first digital detection data for proximity sensing based on the first comparison output signal.

18. The input device according to claim 17, wherein the display panel further comprises a source line,
wherein the processing system further comprises:
a first external connection terminal to be connected to the source line of the display panel;
a second external connection terminal to be connected to the first sensor electrode of the display panel; and
first switch circuitry configured to selectively connect the output of the first source amplifier to the first external connection terminal and connect the first input of the first source amplifier to the second external connection terminal.

19. The input device according to claim 17, wherein the processing system further comprises:
a second source amplifier comprising a third input electrically connectable to a second sensor electrode of the display panel, the second source amplifier configured to:
generate a second drive signal based on a second grayscale voltage corresponding to second pixel data; and
generate a second comparison output signal based on a second sensor signal from the second sensor electrode and the reference voltage,
wherein the analog front end is further configured to generate second digital detection data based on the second comparison output signal outputted from the second source amplifier.

20. The input device according to claim 19, wherein the processing system further comprises:
first voltage output circuitry configured to selectively supply the first grayscale voltage and the reference voltage to a second input of the first source amplifier; and
second voltage output circuitry configured to selectively supply the second grayscale voltage and the reference voltage to a fourth input of the second source amplifier.

21. A method, comprising:
connecting a sensor electrode of a display panel to a first input of a first source amplifier configured to generate a first drive signal for a display element of the display panel based on a first grayscale voltage corresponding to first pixel data;

generating, by the first source amplifier, a first comparison output signal based on a sensor signal from the sensor electrode and a reference voltage; and performing proximity sensing on the display panel based on the first comparison output signal.

22. The method according to claim 21, further comprising:

supplying the first grayscale voltage to the first source amplifier in a display drive operation; and outputting the first drive signal from the first source amplifier in the display drive operation, wherein performing the proximity sensing comprises outputting the first comparison output signal from the first source amplifier.

* * * * *